United States Patent
Ogura et al.

(10) Patent No.: US 7,248,513 B2
(45) Date of Patent: Jul. 24, 2007

(54) SEMICONDUCTOR MEMORY DEVICE HAVING MEMORY BLOCK CONFIGURATION

(75) Inventors: Taku Ogura, Hyogo (JP); Tadaaki Yamauchi, Hyogo (JP); Hidenori Mitani, Hyogo (JP); Takashi Kubo, Hyogo (JP); Kengo Aritomi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 66 days.

(21) Appl. No.: 10/940,764

(22) Filed: Sep. 15, 2004

(65) Prior Publication Data

US 2005/0057963 A1  Mar. 17, 2005

(30) Foreign Application Priority Data

Sep. 16, 2003  (JP) .............................. 2003-323633

(51) Int. Cl.
  G11C 7/00  (2006.01)
  G11C 8/00  (2006.01)
(52) U.S. Cl. ............ 365/200; 365/230.03; 365/230.06; 365/185.09; 365/185.11; 365/185.29
(58) Field of Classification Search ................ 365/200, 365/201, 226, 185.05, 185.09, 185.11, 185.22, 365/185.33, 230.03, 230.06
See application file for complete search history.

(56) References Cited

U.S. PATENT DOCUMENTS

| | | | | |
|---|---|---|---|---|
| 5,444,664 A | * | 8/1995 | Kuroda et al. ............... 365/226 |
| 5,469,390 A | * | 11/1995 | Sasaki et al. ................ 365/200 |
| 5,642,323 A | * | 6/1997 | Kotani et al. ........... 365/230.03 |
| 6,061,289 A | * | 5/2000 | Itoh et al. .................... 365/226 |
| 6,064,621 A | * | 5/2000 | Tanizaki et al. ........ 365/230.03 |
| 6,075,743 A | * | 6/2000 | Barth et al. ............. 365/230.06 |
| 6,081,447 A | * | 6/2000 | Lofgren et al. ......... 365/185.09 |
| 6,154,819 A | * | 11/2000 | Larsen et al. ........... 365/185.33 |
| 6,166,972 A | * | 12/2000 | Hidaka ....................... 365/200 |
| 6,269,030 B1 | * | 7/2001 | Hara .......................... 365/200 |
| 6,297,997 B1 | * | 10/2001 | Ohtani et al. ................ 365/201 |
| 6,388,929 B1 | * | 5/2002 | Shimano et al. ............ 365/201 |
| 6,400,622 B1 | * | 6/2002 | Fujiwara ..................... 365/200 |
| 6,438,044 B2 | * | 8/2002 | Fukuda ....................... 365/200 |
| 6,480,416 B2 | * | 11/2002 | Katayama et al. ...... 365/185.09 |
| 6,480,431 B1 | * | 11/2002 | Hidaka ....................... 365/200 |

(Continued)

FOREIGN PATENT DOCUMENTS

| JP | 2001-84800 | 3/2001 |
|---|---|---|
| JP | 2002-117692 | 4/2002 |

*Primary Examiner*—Trong Phan
(74) *Attorney, Agent, or Firm*—McDermott Will & Emery LLP

(57) ABSTRACT

A memory array including memory mats is arranged in a U shape when seen in two dimensions, and a logic circuit and an analog circuit are arranged in a region unoccupied by the memory array. This facilitates transmission of power supply voltage and signals between the peripheral circuit including the analog and logic circuits and the pad band including power supply and data pads. The analog circuit is positioned close to the power supply pad, so that voltage drop due to the resistance of power supply interconnection is restricted. It is also possible to separate a charge pumping power supply interconnection and a peripheral circuit power supply interconnection in the vicinity of the power supply pad.

7 Claims, 14 Drawing Sheets

U.S. PATENT DOCUMENTS

| | | |
|---|---|---|
| 6,532,181 B2 * | 3/2003 | Saito et al. .................. 365/200 |
| 6,556,479 B2 * | 4/2003 | Makuta et al. ......... 365/185.09 |
| 6,678,195 B2 * | 1/2004 | Hidaka ....................... 365/200 |
| 6,738,286 B2 * | 5/2004 | La Rosa ................ 365/185.05 |
| 6,819,607 B2 * | 11/2004 | Mukai et al. ................ 365/200 |
| 6,888,764 B2 * | 5/2005 | Shiga et al. ................. 365/200 |
| 6,952,368 B2 * | 10/2005 | Miura et al. ........... 365/185.11 |
| 6,975,539 B2 * | 12/2005 | Tran ........................ 365/185.2 |
| 6,982,904 B2 * | 1/2006 | Shiga .................... 365/185.09 |
| 7,068,555 B2 * | 6/2006 | Sugimoto et al. ........... 365/200 |

\* cited by examiner

| | | | | | BGO | BGO |
|---|---|---|---|---|---|---|
| READ OPERATION | BANK1 | BANK2 | | | BANK1 | BANK2 |
| VERIFY OPERATION | | | BANK1 | BANK2 | BANK2 | BANK1 |
| CAL_BANK1 | H | L | H | L | H | H |
| CAUE_BANK1 | H | L | L | L | H | L |
| CAUO_BANK1 | L | L | H | L | L | H |
| CAL_BANK2 | L | H | L | H | H | H |
| CAUE_BANK2 | L | H | L | L | L | H |
| CAUO_BANK2 | L | L | L | H | H | L |

|  | WL | PW | BN | SL | SBL |
|---|---|---|---|---|---|
| UPON WL LEAKAGE MONITORING | VP | VN | VCC | VN | VN |
| UPON SG LEAKAGE MONITORING | VN | VP | VP | VP | VP-Vd |

SEMICONDUCTOR MEMORY DEVICE HAVING MEMORY BLOCK CONFIGURATION

BACKGROUND OF THE INVENTION

1. Field of the Invention

The present invention relates to semiconductor memory devices, and more particularly to a non-volatile semiconductor memory device erasing data in units of blocks.

2. Description of the Background Art

A flash memory, one type of the non-volatile semiconductor memory devices, erases data in units of blocks. Specifically, in the flash memory, a high voltage is applied between a word line and a well & source line of a memory cell to perform an erase operation.

In a memory mat of the flash memory, when a word line and a bit line, or a word line and a well & source line, are short-circuited, the resulting leakage current will lower the level of the high voltage applied between the word line and the well & source line of the memory cell at the time of erase operation, and thus, the flash memory suffers an erase failure. Since the flash memory erases data in units of blocks, the erase failure occurs in units of blocks as well.

To recover the erase failure in the flash memory, a spare block is required for replacement on a block basis. Mounting a spare block to the flash memory inevitably increases the chip area. Thus, it is important in a floor plan (circuit layout design) of the flash memory to make a peripheral circuit effectively shared by normal blocks to suppress the increase of the chip area.

The floor plan of the flash memory is also important to suppress the adverse effect of the power supply noise on the peripheral circuit due to a high voltage generating circuit characteristic to the flash memory. Moreover, the floor plan of the flash memory is important to decrease the aspect ratio (width-length ratio) of a logic circuit band that is laid out using an automatic layout and wiring tool. The decrease of the aspect ratio of the logic circuit band can improve the degree of integration of the flash memory.

When a spare block is mounted to the flash memory, a non-selecting process of a defective block caused by a leakage current becomes critical. In a wafer test (WT) of the flash memory, a voltage stress apply test is performed on all blocks at once. At this time, it is necessary to suppress a voltage drop in the defective block due to the leakage current. To this end, application of the voltage stress to the defective block should be suppressed.

A non-volatile semiconductor memory device (flash memory) described in Japanese Patent Laying-Open No. 2001-084800 automatically detects an address of failure that would cause a decrease of an output voltage of a boost circuit in the batch write/erase test mode. The address is stored in a storage circuit to prevent a high voltage stress from being applied thereto, to thereby implement a batch write/erase test on memory cells that is performed prior to use of a redundant circuit.

The above-described non-volatile semiconductor memory device, however, monitors a change of the potential driven from a drive voltage generating circuit to determine a defective block, taking no account of floor plan. This leads to an increase of the chip area, and direct monitoring of the leakage current in the defective block is impossible.

SUMMARY OF THE INVENTION

An object of the present invention is to provide a semiconductor memory device enabling a non-selecting process of a defective block, while suppressing an increase of chip area.

According to an aspect of the present invention, a semiconductor memory device includes: a memory array having a U-shaped configuration in the two-dimensional directions; an analog circuit and a logic circuit arranged in a hollow portion formed by the arrangement of the memory array; and a power supply pad arranged in the vicinity of the analog circuit and the logic circuit, out of contact with the memory array.

According to another aspect of the present invention, a semiconductor memory device includes: a plurality of memory blocks including a normal block and a spare block; a memory array storing block information formed of spare block replacement information for each of the plurality of memory blocks and defective spare block information; a spare block determination circuit receiving the block information and outputting a spare block determination signal determining whether the plurality of memory blocks are normal or defective; and a decode circuit receiving the spare block determination signal and performing decoding for each of the plurality of memory blocks.

According to the present invention, the non-selecting process of a defective block becomes possible while the increase of the chip area is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
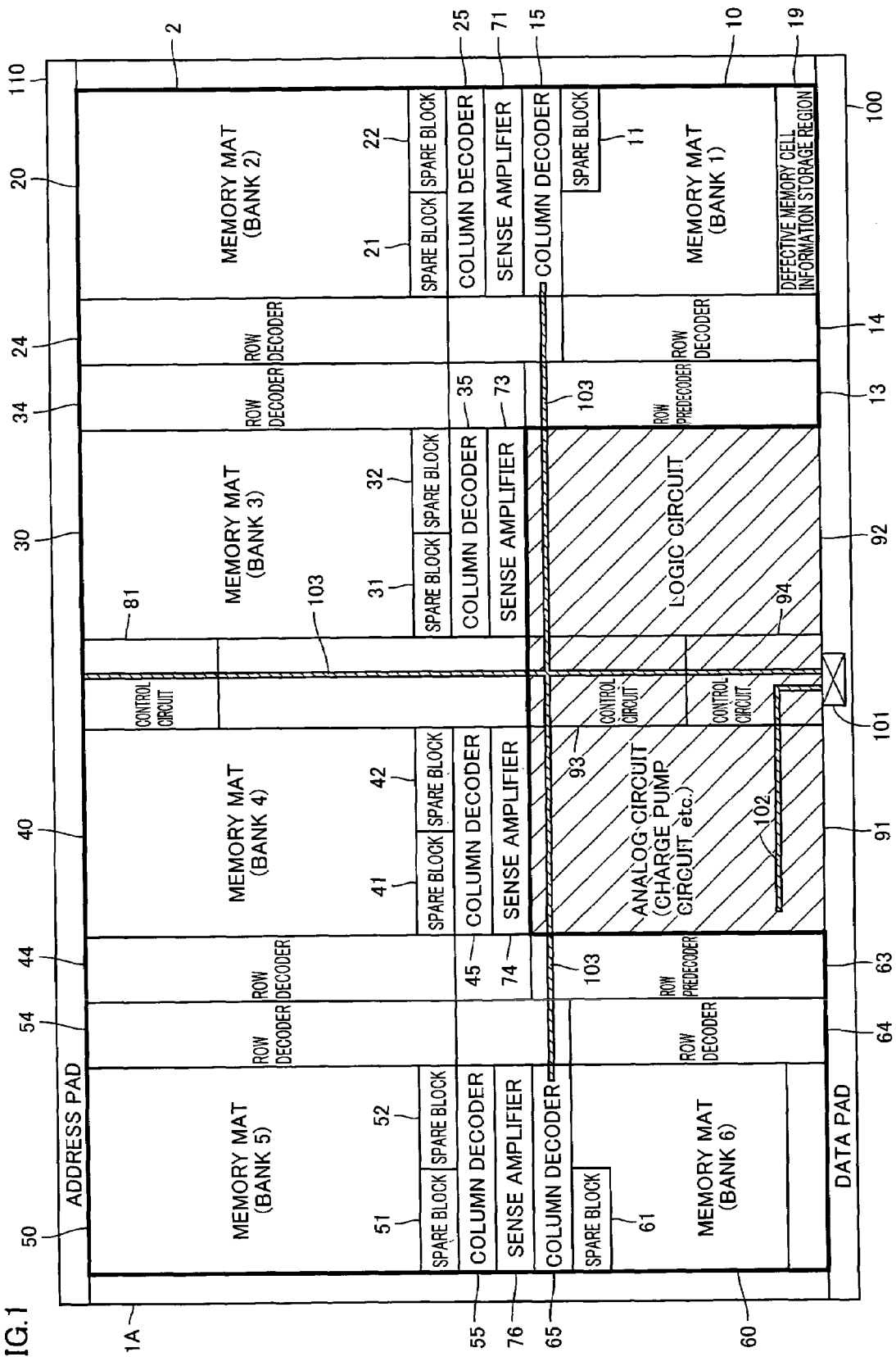
FIG. 1 is a block diagram showing a configuration of a non-volatile semiconductor memory device 1A according to a first embodiment of the present invention.

Hereinafter, embodiments of the present invention will be described in detail with reference to the drawings. Throughout the drawings, the same reference characters denote the same or corresponding portions, and description thereof will not be repeated.

First Embodiment

Referring to FIG. 1, the non-voltage semiconductor memory device 1A according to the first embodiment of the present invention includes a memory array 2 (delimited by a bold line in FIG. 1) arranged in a U shape when seen in two dimensions, an analog circuit 91, a logic circuit 92, control circuits 93, 94, a data pad 100, a power supply pad 101, and an address pad 110. Memory array 2 includes memory mats 10, 20, 30, 40 (of, e.g., 28 Mb each), a defective memory cell information storage region 19, memory mats 50, 60 (of, e.g., 8 Mb each), spare blocks 11, 21, 22, 31, 32, 41, 42, 51, 52, 61, row predecoders 13, 63, row decoders 14, 24, 34, 44, 54, 64, column decoders 15, 25, 35, 45, 55, 65, sense amplifiers 71, 73, 74, 76, and a control circuit 81.

Memory mat 10 (also referred to as a bank 1) includes spare block 11. Row predecoder 13 and row decoder 14 activate a word line (not shown) and others of memory mat 10. Column decoder 15 activates a bit line (not shown) and others of memory mat 10. Defective memory cell information storage region 19 is a non-volatile memory where a user cannot write or erase data and where normal/defective information for each block is stored.

Memory mat 20 (also referred to as a bank 2) includes spare blocks 21, 22. Row decoder 24 activates a word line (not shown) and others of memory mat 20. Column decoder 25 activates a bit line (not shown) and others of memory mat 20. Sense amplifier 71 is commonly provided for memory mats 10, 20, and senses and amplifies a potential difference of a bit line pair (not shown) in each of memory mats 10, 20. Hereinafter, more detailed configurations and operations of sense amplifier 71 commonly provided for memory mats 10, 20 and column decoders 15, 25 will be described with reference to FIG. 2.

Figure 2:
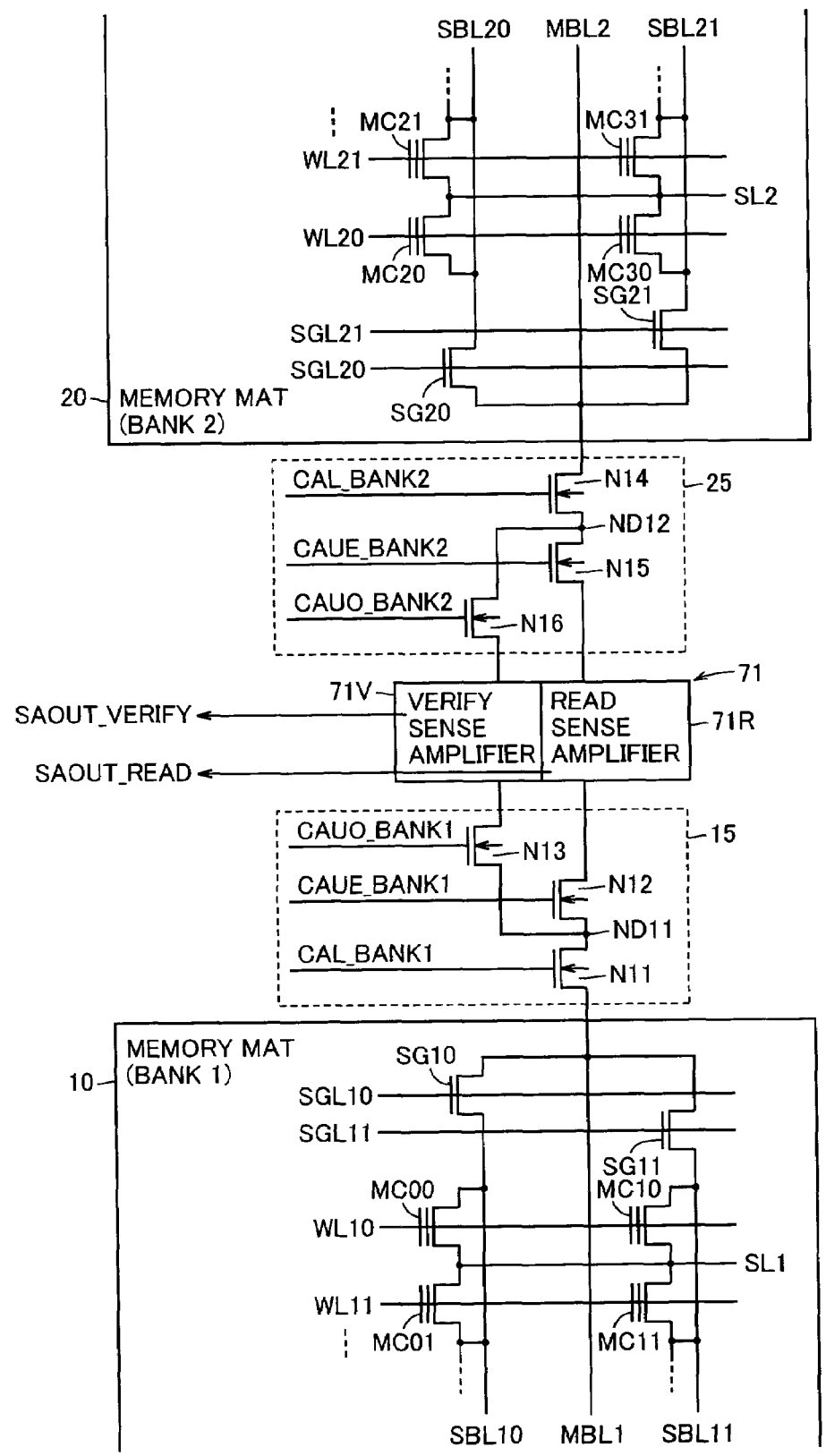
FIG. 2 is a circuit diagram showing configurations of a sense amplifier 71 and column decoders 15, 25 that are commonly provided for memory mats 10, 20.

Referring to FIG. 2, sense amplifier 71 includes a read sense amplifier 71R and a verify sense amplifier 71V.

Column decoder 15 includes N channel MOS transistors N11, N12, and N13. N channel MOS transistor N11 is connected between a main bit line MBL1 from memory mat 10 and a node ND11, and has its gate receiving a column control signal CAL_BANK1. N channel MOS transistor N12 is connected between node ND11 and read sense amplifier 71R, and has its gate receiving a column control signal CAUE_BANK1. N channel MOS transistor N13 is connected between node ND11 and verify sense amplifier 71V, and has its gate receiving a column control signal CAUO_BANK1.

Column decoder 25 includes N channel MOS transistors N14, N15, and N16. N channel MOS transistor N14 is connected between a main bit line MBL2 from memory mat 20 and a node ND12, and has its gate receiving a column control signal CAL_BANK2. N channel MOS transistor N15 is connected between node ND12 and read sense amplifier 71R, and has its gate receiving a column control signal CAUE_BANK2. N channel MOS transistor N16 is connected between node ND12 and verify sense amplifier 71V, and has its gate receiving a column control signal CAUO_BANK2.

Memory mat 10 includes select gates SG10 and SG11 (each formed of an N channel MOS transistor), and memory cells MC00, MC01, MC10, and MC11. Select gate SG10 is connected between main bit line MBL1 and a sub bit line SBL10, and has its gate connected to a select gate line SGL10. Select gate SG11 is connected between main bit line MBL1 and a sub bit line SBL11, and has its gate connected to a select gate line SGL11.

Memory cell MC00 is connected between sub bit line SBL10 and a source line SL1, and has its gate connected to a word line WL10. Memory cell MC01 is connected between source line SL1 and sub bit line SBL10, and has its gate connected to a word line WL11. Memory cell MC10 is connected between sub bit line SBL11 and source line SL1, and has its gate connected to word line WL10. Memory cell MC11 is connected between source line SL1 and sub bit line SBL11, and has its gate connected to word line WL11.

Memory mat 20 includes select gates SG20, SG21 (each formed of an N channel MOS transistor), and memory cells MC20, MC21, MC30, MC31. Select gate SG20 is connected between a main bit line MBL2 and a sub bit line SBL20, and has its gate connected to a select gate line SGL20. Select gate SG21 is connected between main bit line MBL2 and a sub bit line SBL21, and has its gate connected to a select gate line SGL21.

Memory cell MC20 is connected between sub bit line SBL20 and a source line SL2, and has its gate connected to a word line WL20. Memory cell MC21 is connected between source line SL2 and sub bit line SBL20, and has its gate connected to a word line WL21. Memory cell MC30 is connected between sub bit line SBL21 and source line SL2, and has its gate connected to word line WL20. Memory cell MC31 is connected between source line SL2 and sub bit line SBL21, and has its gate connected to word line WL21.

Read sense amplifier 71R receives signals input via N channel MOS transistors N12, N15, respectively, and outputs a read output signal SAOUT_READ. Verify sense amplifier 71V receives signals input via N channel MOS transistors N13, N16, respectively, and outputs a verify output signal SAOUT_VERIFY. Hereinafter, signal levels of the column control signals in the read and verify operations of banks 1, 2 will be described with reference to FIG. 3.

Figures 3, 4:
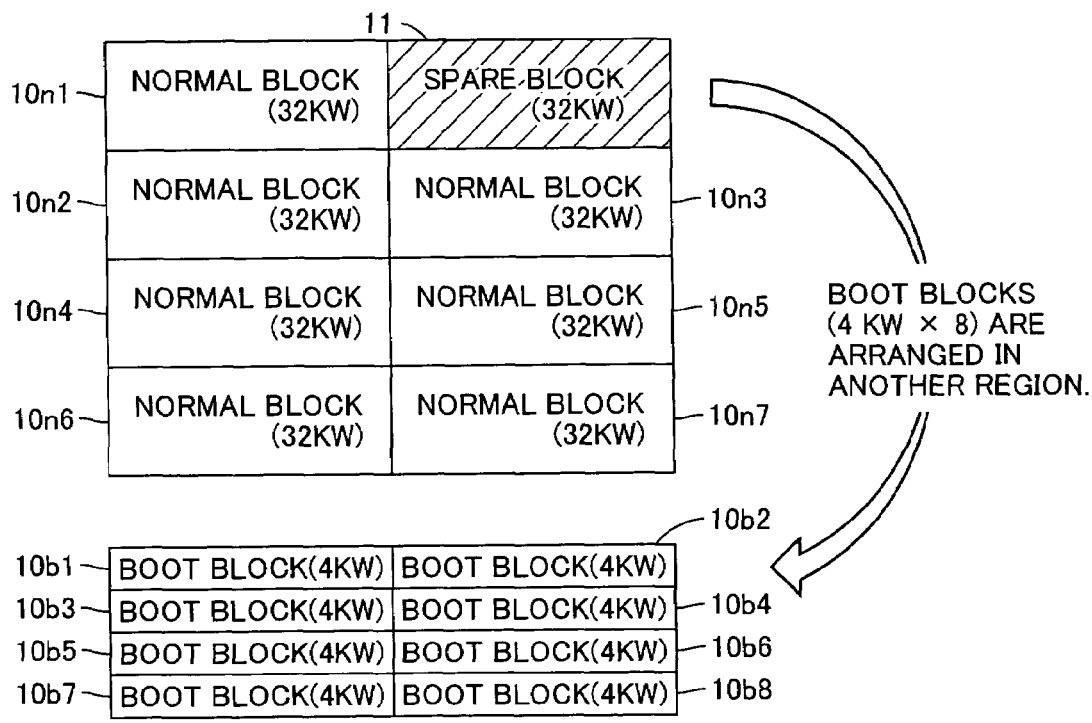
FIG. 3 shows signal levels of column control signals in read and verify operations of banks 1, 2.
FIG. 4 is a block diagram showing a more detailed block configuration of the memory mat 10 in the non-volatile semiconductor memory device 1A of the first embodiment.

Referring to FIG. 3, in the read operation of bank 1, column control signals CAL_BANK1, CAUE_BANK1, CAUO_BANK1 input to column decoder 15 attain an H (logical high) level, an H level, and an L (logical low) level, respectively. At this time, main bit line MBL1 and read sense amplifier 71R in FIG. 2 are electrically connected to each other. Read sense amplifier 71R receives data read from main bit line MBL1, and outputs read output signal SAOUT_READ. On the other hand, column control signals CAL_BANK2, CAUE_BANK2, CAUO_BANK2 input to column decoder 25 all attain an L level. As such, in FIG. 2, main bit line MBL2 is electrically disconnected from read sense amplifier 71R and verify sense amplifier 71V.

In the read operation of bank 2, column control signals CAL_BANK1, CAUE_BANK1, CAUO_BANK1 input to column decoder 15 all attain an L level. As such, main bit line MBL1 is electrically disconnected from read sense amplifier 71R and verify sense amplifier 71V in FIG. 2. On the other hand, column control signals CAL_BANK2, CAUE_BANK2, CAUO_BANK2 input to column decoder 25 attain an H level, an H level and an L level, respectively. At this time, main bit line MBL2 is electrically connected to read sense amplifier 71R in FIG. 2. Read sense amplifier 71R receives data read from main bit line MBL2, and outputs read output signal SAOUT_READ.

In the verify operation of bank 1, column control signals CAL_BANK1, CAUE_BANK1, CAUO_BANK1 input to column decoder 15 attain an H level, an L level, and an H level, respectively. At this time, main bit line MBL1 is electrically connected to verify sense amplifier 71V in FIG. 2. Verify sense amplifier 71V receives data from main bit line MBL1, and outputs verify output signal SAOUT_VERIFY. On the other hand, column control signals CAL_BANK2, CAUE_BANK2, CAUO_BANK2 input to column decoder 25 all attain an L level. As such, main bit line MBL2 is electrically disconnected from read sense amplifier 71R and verify sense amplifier 71V in FIG. 2.

In the verify operation of bank 2, column control signals CAL_BANK1, CAUE_BANK1, CAUO_BANK1 input to column decoder 15 all attain an L level. As such, main bit line MBL1 is electrically disconnected from read sense amplifier 71R and verify sense amplifier 71V in FIG. 2. On the other hand, column control signals CAL_BANK2, CAUE_BANK2, CAUO_BANK2 input to column decoder 25 attain an H level, an L level and an H level, respectively. At this time, main bit line MBL2 is electrically connected to verify sense amplifier 71V in FIG. 2. Verify sense amplifier 71V receives data from main bit line MBL2, and outputs verify output signal SAOUT_VERIFY.

When the read operation of bank 1 and the verify operation of bank 2 are performed simultaneously, column control signals CAL_BANK1, CAUE_BANK1, CAUO_BANK1 input to column decoder 15 attain an H level, an H level, and an L level, respectively. At this time, main bit line MBL1 is electrically connected to read sense amplifier 71R in FIG. 2. Read sense amplifier 71R receives data read from main bit line MBL1, and outputs read output signal SAOUT_READ. On the other hand, column control signals CAL_BANK2, CAUE_BANK2, CAUO_BANK2 input to column decoder 25 attain an H level, an L level, and an H level, respectively. At this time, main bit line MBL2 is electrically connected to verify sense amplifier 71V in FIG. 2. Verify sense amplifier 71V receives data from main bit line MBL2, and outputs verify output signal SAOUT_VERIFY.

When the verify operation of bank 1 and the read operation of bank 2 are performed simultaneously, column control signals CAL_BANK1, CAUE_BANK1, CAUO_BANK1 input to column decoder 15 attain an H level, an L level, and an H level, respectively. At this time, main bit line MBL1 is electrically connected to verify sense amplifier 71V in FIG. 2. Verify sense amplifier 71V receives data from main bit line MBL1, and outputs verify output signal SAOUT_VERIFY. On the other hand, column control signals CAL_BANK2, CAUE_BANK2, CAUO_BANK2 input to column decoder 25 attain an H level, an H level, and an L level, respectively. At this time, main bit line MBL2 is electrically connected to read sense amplifier 71R in FIG. 2. Read sense amplifier 71R receives data read from main bit line MBL2, and outputs read output signal SAOUT_READ.

Performing the read operation of a memory bank during the write, erase or verify operation of another bank as described above is called BGO (Back Ground Operation). Providing sense amplifier 71 commonly for memory mats 10, 20 as shown in FIG. 2 and controlling the column control signals by BGO makes it possible, e.g., to read data from memory mat 20 while writing data to memory mat 10 by simply switching the addresses. As such, memory mats 10, 20 can not only perform the write, read and other operations alone, but also implement the complex operations by BGO.

Referring again to FIG. 1, memory mat 30 (also referred to as a bank 3) includes spare blocks 31, 32. Row decoder 34 activates a word line (not shown) and others of memory mat 30. Column decoder 35 activates a bit line (not shown) and others of memory mat 30. Sense amplifier 73 senses and amplifies a potential difference of a bit line pair (not shown) in memory mat 30. Memory mat 40 (also referred to as a bank 4) includes spare blocks 41, 42. Row decoder 44 activates a word line (not shown) and others of memory mat 40. Column decoder 45 activates a bit line (not shown) and others of memory mat 40. Sense amplifier 74 senses and amplifies a potential difference of a bit line pair (not shown) in memory mat 40.

Memory mat 50 (also referred to as a bank 5) includes spare blocks 51, 52. Row decoder 54 activates a word line (not shown) and others of memory mat 50. Column decoder 55 activates a bit line (not shown) and others of memory mat 50. Memory mat 60 (also referred to as a bank 6) includes a spare block 61. Row predecoder 63 and row decoder 64 activate a word line (not shown) and others of memory mat 60. Column decoder 65 activates a bit line (not shown) and others of memory mat 60. Sense amplifier 76 is commonly provided for memory mats 50, 60, and senses and amplifies a potential difference of a bit line pair (not shown) in each of memory mats 50, 60. As such, memory mats 50, 60 can not only perform the write, read and other operations alone, but also implement the complex operations by BGO, as described above in conjunction with FIGS. 2, 3.

Control circuit 81, although not specifically shown in FIG. 1, includes, e.g., a WE buffer 120 and an address buffer 140, details of which will be described later. Analog circuit 91, although not specifically shown in FIG. 1, includes an internal high-voltage generating circuit 931 and others, which will be described later. Logic circuit 92, although not specifically shown in FIG. 1, includes a CUI (Command User Interface) 98 and a CPU (Central Processing Unit) 99, which will also be described later.

Control circuit 93, although not specifically shown in FIG. 1, includes, e.g., a CE buffer 130, a spare block control circuit 210 and a sense control circuit 240S, which will be described later in detail. Control circuit 94, although not specifically shown in FIG. 1, includes a data control circuit 250 and an input/output buffer circuit 260, which will also be described later.

Data pad 100 is a pad through which data signals are sent to and received from the outside. Power supply pad 101 extends a charge pumping power supply interconnection 102 for supplying a power supply voltage to internal high-voltage generating circuit 931 (not shown) and others in analog circuit 91. Power supply pad 101 also extends a peripheral circuit power supply interconnection 103 for supplying a power supply voltage to column decoders 15, 65 and others. Address pad 110 is for sending and receiving address signals to and from the outside.

In mounting spare blocks, efficient arrangement of the spare blocks to implement the BGO is critical. If the spare blocks are arranged in a small array separated from the main array, circuitry such as row decoder, column decoder, sense amplifier and others will be required for each spare block, leading to an increase of so-called area penalty. To avoid such area penalty, it is necessary to arrange one or more spare blocks for each memory bank and to make the spare block(s) share the above-described circuitry with normal blocks in the same memory bank.

In the non-volatile semiconductor memory device 1A of the first embodiment shown in FIG. 1, spare blocks are arranged for respective memory mats 10-60, and sense amplifiers 71, 76 are commonly arranged for memory mats 10, 20 and 50, 60, respectively. This can suppress the increase of circuit area to the minimum, while implementing the BGO.

In a conventional floor plan, arrangement of the memory mats occupying a large area in the chip has been given priority, due to the constraints of the aspect ratio of the chip to be accommodated in a package and the number of banks of the memory mats. As such, the logic and analog circuits have be arranged in unoccupied spaces at high aspect ratio, leading to degradation in efficiency of circuit arrangement.

For layout of the logic circuit, an automatic layout and wiring tool is usually employed. In a region of high aspect ratio, wiring is often difficult, and the degree of integration is likely to decrease. As such, in a region for arranging the logic circuit, it has been necessary to decrease the aspect ratio to secure the wiring area, to thereby increase the degree of integration.

The analog circuit includes a charge pump circuit and others consuming large power. If the analog circuit is arranged at a long distance from the power supply pad, the power supplying capability may be decreased with a voltage drop due to the resistance of the power supply interconnection. Further, if the power supply interconnection for the charge pump circuit and that for the peripheral circuit such as a decoder are shared, the voltage drop of the power supply voltage at the time of charge pumping operation will cause an access delay due to the delay in operation of the peripheral circuit.

In the non-volatile semiconductor memory device 1A of the first embodiment, as shown in FIG. 1, memory array 2 including memory mats 10-60 is arranged in a U shape, and logic circuit 92 and analog circuit 91 including the charge pump circuit and others are arranged in a region unoccupied by memory array 2.

When a flash memory is mounted in an MCP (Multi Chip Package), another chip may be mounted on top of the flash memory. Thus, it is necessary to arrange the pad band on the side surface, rather than at the center as in the case of a DRAM (Dynamic Random Access Memory). If memory array 2 is arranged in a box shape as in a conventional flash memory, it would be difficult to transmit the power supply voltage and signals between the peripheral circuit arranged within the box shape and the pad band surrounding the same. In contrast, if memory array 2 is arranged in the U shape, it is readily possible to transmit the power supply voltage and signals between the peripheral circuit including logic circuit 92 and others and the pad band including power supply pad 101, data pad 100 and others.

Further, arranging logic circuit 92 in a region unoccupied by memory array 2 can decrease the aspect ratio in terms of logic circuit 92, and thus, the degree of integration when performing the automatic arrangement and wiring is improved.

Moreover, since analog circuit 91 is arranged in the region unoccupied by memory array 2, analog circuit 91 is closer to power supply pad 101. This can suppress the voltage drop due to the resistance of the power supply interconnection. It is also possible to separate charge pumping power supply interconnection 102 from peripheral circuit power supply interconnection 103 in the vicinity of power supply pad 101. Here, the peripheral circuit refers to accessing circuitry, which includes, e.g., logic circuit 92 and others.

With the configuration described above, it is possible to prevent an adverse effect of the noise generated during the charge pumping operation by internal high-voltage generating circuit 931 and others on the peripheral circuit. Hereinafter, a more detailed block configuration of memory mat 10 in non-volatile semiconductor memory device 1A of the first embodiment will be described with reference to FIG. 4.

As shown in FIG. 4, memory mat 10 includes normal blocks $10n1$-$10n7$ (of 32 KW each) as units of batch erase. Memory mat 10 also includes boot blocks $10b1$-$10b8$ (of 4 KW each) existent in a NOR-type flash memory. Boot blocks $10b1$-$10b8$ constitute the batch erase units smaller in size than normal blocks $10n1$-$10n7$, and are used, e.g., for storage of a booting code. Herein, "W" represents a unit "word" of storage capacity, and "K" represents "kilo" ($1 \times 10^3$).

Boot blocks $10b1$-$10b8$ of 4 KW each, differing in memory size from normal blocks $10n1$-$10n7$ of 32 KW each, may cause distortion in layout. Thus, boot blocks $10b1$-$10b8$, having total capacity of 32 KW, are arranged in a region physically different from the region where normal blocks $10n1$-$10n7$ are arranged. This poses a problem that no element is arranged in a portion of the normal block region originally assigned to the boot blocks.

In memory mat 10 of non-volatile semiconductor memory device 1A of the first embodiment shown in FIG. 4, this portion is used for spare block 11. Spare block 11 is for replacement of any of normal blocks $10n1$-$10n7$ that becomes defective. This enables effective use of the portion of the normal block region originally assigned to the boot blocks.

As described above, according to the first embodiment, memory array 2 including memory mats 10-60 is arranged in the U shape, and logic circuit 92 and analog circuit 91 are arranged in a region unoccupied by the memory array. Accordingly, it is possible to prevent an adverse effect of the noise generated during the charge pumping operation on the peripheral circuit including the decoder, while suppressing the increase of the chip area.

Second Embodiment

When the spare blocks are mounted as in non-volatile semiconductor memory device 1A of the first embodiment, the non-selecting process of a defective block due to the leakage is important, as described above. In the WT of a non-volatile semiconductor memory device (flash memory), a voltage stress apply test is carried out in a batch of all blocks. At this time, it should be ensured that the voltage stress is not applied to a defective block, to suppress the voltage drop in the defective block due to the leak component.

To this end, it is necessary to arrange, in each block address decoder, a register for storing normal/defective information of each block. This register is often of a volatile type, which poses a problem that the information is erased every time power is turned on for testing. On the other hand, if a tester provides different information for each chip in each test, the number of simultaneously testable chips will decrease.

Here, the normal/defective information of each block includes spare block replacement information, indicating which defective block is to be replaced with which spare block, and defective spare block information, indicating a non-replaceable spare block due to defectiveness. If data of the defective spare block information is "1", all data should be erased to make the data attain "1", which requires rewriting of the preceding data. Thus, the defective spare block information should take data "0" to allow overwrite when a normal spare block becomes defective during the test.

At the time of WT, if the chip is in the state prior to LT (Laser Trimming), the spare block replacement information stored in a non-volatile memory region within the chip should be transferred to a fuse register. After LT, the fuse information of the fuse register is used as it is. The spare block replacement information having been transferred to the fuse register should then be transferred to a register for storing normal/defective information for each block that is arranged in each block address decoder.

To transfer the spare block replacement information in one stage, it is necessary to store the normal/defective information for each block in the non-volatile memory region within the chip. To transfer the normal/defective information for each block provided in each block address decoder to the register, signal lines of the number corresponding to the number of blocks become necessary. The number of blocks in the chip increases as the increase of the chip capacity. When the number of blocks increases, the layout is restricted, and it becomes difficult to arrange the signal lines for the chip. A non-volatile semiconductor memory device 1B according to the second embodiment of the present invention solving the above-described problems will now be described with reference to FIG. 5.

Figure 5:
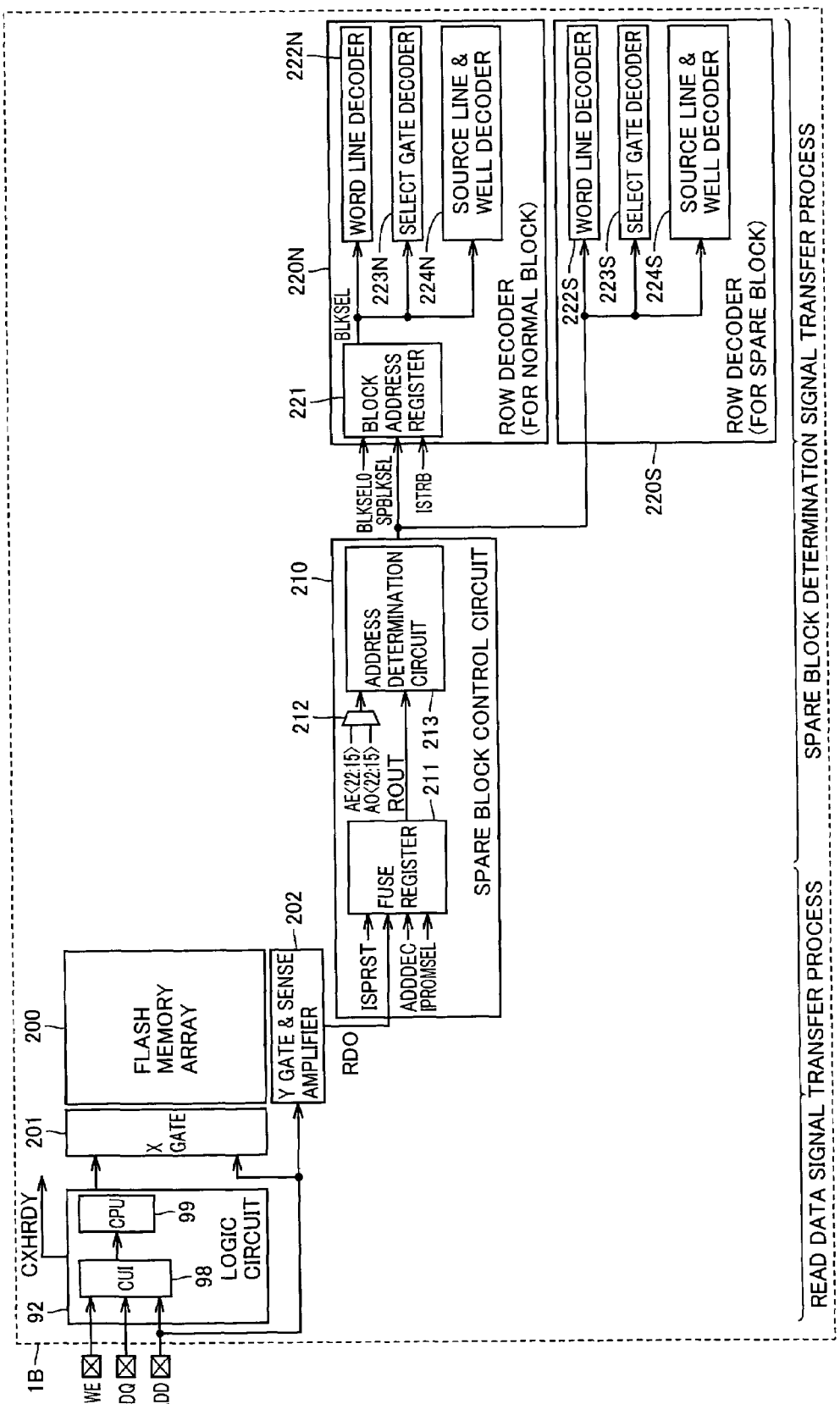
FIG. 5 is a block diagram showing a configuration of a non-volatile semiconductor memory device 1B according to a second embodiment of the present invention.

Referring to FIG. 5, non-volatile semiconductor memory device 1B of the second embodiment includes a logic circuit 92, a flash memory array 200, an X gate 201, a Y gate & sense amplifier 202, a spare block control circuit 210, and row decoders 220N, 220S.

Logic circuit 92 includes a CUI 98 and a CPU 99. CUI 98 externally receives a write enable signal/WE, a data signal DQ, an address signal ADD and others, and decodes these commands. CPU 99 receives the decoded results of CUI 98, and controls the entire non-volatile semiconductor memory device 1B including flash memory array 200. CPU 99 starts an operation when a write state machine information signal CXHRDY makes a transition from an H level to an L level.

A flash memory array portion, formed of flash memory array 200, X gate 201, and Y gate & sense amplifier 202, is controlled by CPU 99. Although flash memory array 200 includes both memory mats 10-60 and defective memory cell information storage region 19 as described in the first embodiment, the function of defective memory cell information storage region 19 that stores normal/defective information for each block in a region where a user cannot write or erase data is primarily shown in FIG. 5. Y gate & sense amplifier 202 outputs to spare block control circuit 210 read data signal RDO corresponding to the data stored in and read from flash memory array 200.

Spare block control circuit 210 includes a fuse register 211, an address select circuit 212 and an address determination circuit 213. Fuse register 211 receives a register initialization signal ISPRST, read data signal RDO, an address decode signal ADDDEC, and an information switching signal IPROMSEL, and outputs a register output signal ROUT to address determination circuit 213.

Register initialization signal ISPRST controls initialization of fuse register 211. Address decode signal ADDDEC is used when transferring read data signal RDO corresponding to the data stored in and read from flash memory array 200 to fuse register 211. Information switching signal IPROMSEL selects one of the fuse information stored in fuse register 211 and the read data signal RDO stored in flash memory array 200 for use. A specific circuit configuration of fuse register 211 will be described later.

Address select circuit 212 selects one of internal address signals AE<22:15> and AO<22:15> and outputs the selected one to address determination circuit 213. Address determination circuit 210 receives the internal address signal from address select circuit 212 and register output signal ROUT, and outputs a spare block determination signal SPBLKSEL to row decoders 220N, 220S.

Row decoder 220N is for a normal block (not shown), and includes a block address register 221, a word line decoder 222N, a select gate decoder 223N, and a source line & well decoder 224N. Block address register 221 receives a block select control signal BLKSEL0, spare block determination signal SPBLKSEL, and a data in strobe signal ISTRB, and outputs a block determination signal BLKSEL determining normalness/defectiveness of the block. Data in strobe signal ISTRB is used for taking in spare block determination signal SPBLKSEL to block address register 221. A specific circuit configuration of block address register 221 will be described later.

Word line decoder 222N receives block determination signal BLKSEL, and decodes a signal of a word line. Select gate decoder 223N receives block determination signal BLKSEL, and decodes a signal of a select gate. Source line & well decoder 224N receives block determination signal BLKSEL, and decodes signals of a source line and a well.

Row decoder 220S is for a spare block (not shown), and includes a word line decoder 222S, a select gate decoder 223S, and a source line & well decoder 224S. Word line decoder 222S receives spare block determination signal SPBLKSEL, and decodes a signal of a word line. Select gate decoder 223S receives spare block determination signal SPBLKSEL, and decodes a signal of a select gate. Source line & well decoder 224S receives spare block determination signal SPBLKSEL, and decodes signals of a source line and a well. The above-described normal and spare blocks, not shown, are collectively called "memory blocks" in the second embodiment.

Hereinafter, description is made for roughly divided two processes of a read data signal transfer process where read data signal RDO read from flash memory array 200 is transferred to fuse register 211, and a spare block determination signal transfer process where spare block determination signal SPBLKSEL output from address determination circuit 210 is transferred to block address register 21. Transferring the spare block replacement information in two stages as described above eliminates the need to directly transfer the spare block replacement information to each spare block, and thus, reduces the number of signal lines required for transferring the spare block replacement information from flash memory 200 to each spare block. Hereinafter, a specific circuit configuration of fuse register 211 that is critical to the read data signal transfer process will firstly be described with reference to FIG. 6.

Figure 6:
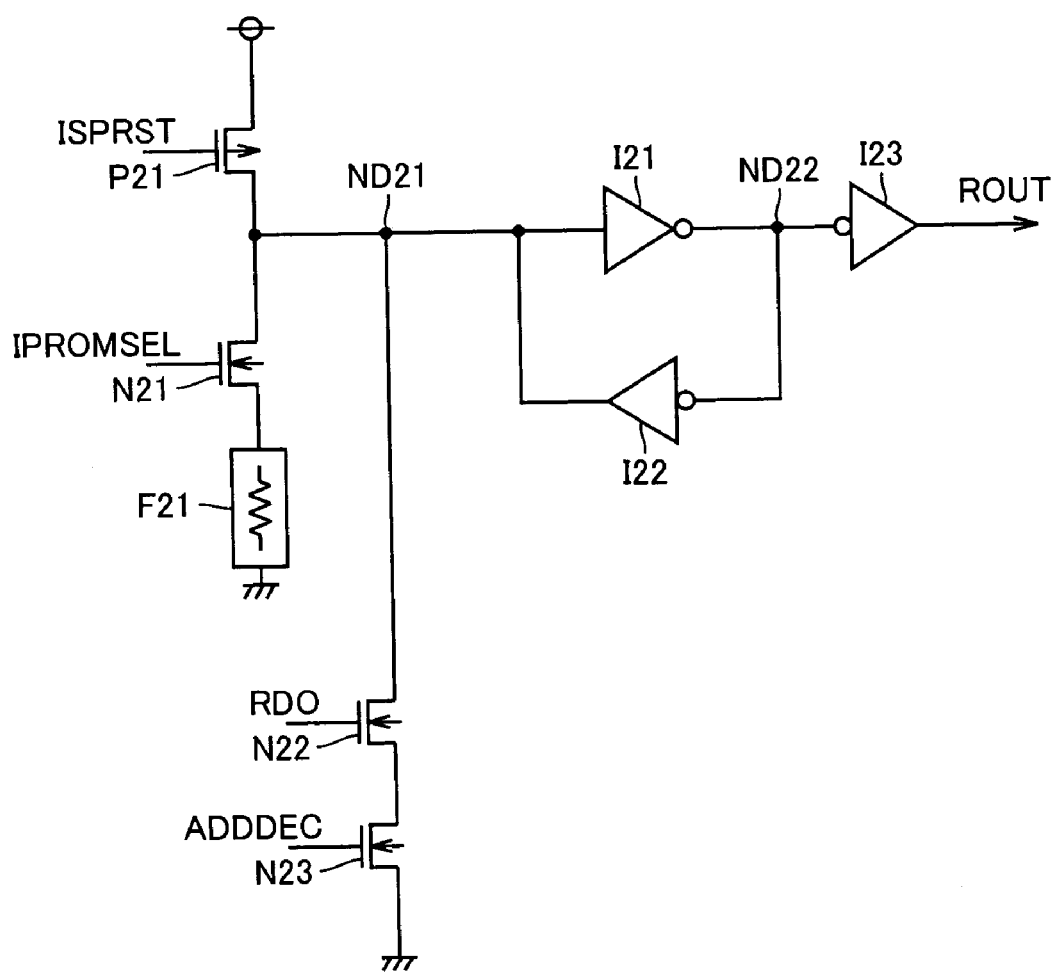
FIG. 6 is a circuit diagram showing a circuit configuration of a fuse register 211 according to the second embodiment of the present invention.

Referring to FIG. 6, fuse register 211 of the second embodiment includes a P channel MOS transistor P21, N channel MOS transistors N21, N22, N23, a fuse F21, and inverters I21, I22, I23.

P channel MOS transistor P21 is connected between a power supply node and a node ND21, and has its gate receiving register initialization signal ISPRST. N channel MOS transistor N21 has a drain connected to node ND21, a source connected to fuse F21, and a gate receiving information switching signal IPROMSEL. Fuse F21 is connected between N channel MOS transistor N21 and a ground node.

N channel MOS transistors N22, N23 are connected in series between node ND21 and a ground node. N channel MOS transistor N22 has its gate receiving read data signal RDO. N channel MOS transistor N23 has its gate receiving address decode signal ADDDEC. Inverters I21, I22 are connected in a loop between node ND21 and a node ND22. Inverter I23 has its input terminal connected to node ND22, and outputs register output signal ROUT. Hereinafter, circuit operations in the read data signal transfer process including the circuit operation of fuse register 211 will be described with reference to operation waveforms of primary signals shown in FIG. 7.

Figure 7:
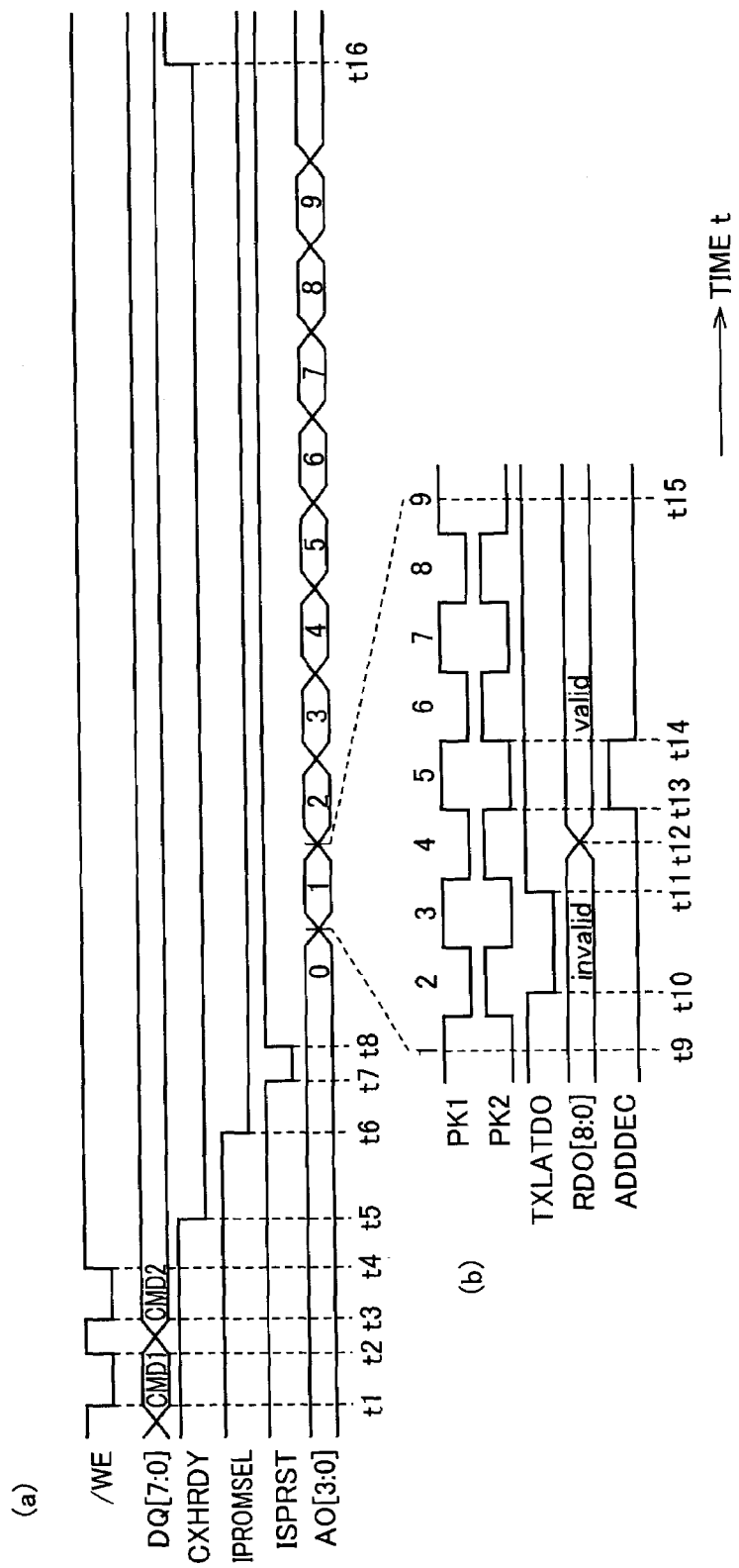
FIG. 7 is a timing chart illustrating operation waveforms of primary signals in a read data signal transfer process.

Referring to (a) of FIG. 7, write enable signal/WE falls from an H level to an L level at time t1, and rises from the L level to an H level at time t2. In response, a command signal CMD1 is generated in data signal DQ[7:0]. Write enable signal/WE again falls from the H level to an L level at time t3, and rises from the L level to an H level at time t4. In response, a command signal CMD2 is generated in data signal DQ[7:0].

At time t5, write state machine information signal CXHRDY falls from an H level to an L level. In response, CPU 99 of FIG. 5 starts an operation. At time t6, information switching signal IPROMSEL falls from an H level to an L level. As such, referring to FIG. 6, fuse F21 is electrically disconnected from node ND21. As a result, referring to FIG. 5, there occurs a state transition from the state where information of fuse register 211 is used to the state where data stored in flash memory 200 is used.

At time t7, register initialization signal ISPRST falls from an H level to an L level. As such, node ND21 of FIG. 6 is precharged to an H level. As a result, fuse register 211 is initialized. At time t8, register initialization signal ISPRST rises from the L level to an H level. At time t9, an internal address signal AO[3:0] is incremented. Operations of various signals from time t9 when internal address signal AO[3:0] is incremented until time t15 when it is incremented again, will now be described with reference to (b) of FIG. 7.

Referring to (b) of FIG. 7, internal CPU clock signals PK1, PK2 change complementarily to each other. CPU 99 of FIG. 5 increments internal address signal AO[3:0] in synchronization with internal CPU clock signals PK1, PK2. A sense control signal TXLATDO falls from an H level to an L level at time t10, and rises from the L level to an H level at time t11. At t12, read data signal RDO[8:0] switches from an invalid state to a valid state.

Address decode signal ADDDEC, in synchronization with internal CPU clock signals PK1, PK2, rises from an L level to an H level at time t13. As such, N channel MOS transistor N23 of FIG. 6 becomes conductive. As a result, information of read data signal RDO is reflected to node ND21 of FIG. 6. Specifically, read data signal RDO is taken into fuse register 211. At time t14, address decode signal ADDDEC falls from the H level to an L level in synchronization with internal CPU clock signals PK1, PK2.

Returning to (a) of FIG. 7, at time t16, write state machine information signal CXHRDY rises from the L level to an H level. In response, CPU 99 of FIG. 5 finishes the operation. Information switching signal IPROMSEL, however, is held at the L level, since it is necessary to keep fuse F21 electrically disconnected from node ND 21. Hereinafter, a specific circuit configuration of block address register 221 that is critical to the spare block determination signal transfer process will be described with reference to FIG. 8.

Figure 8:
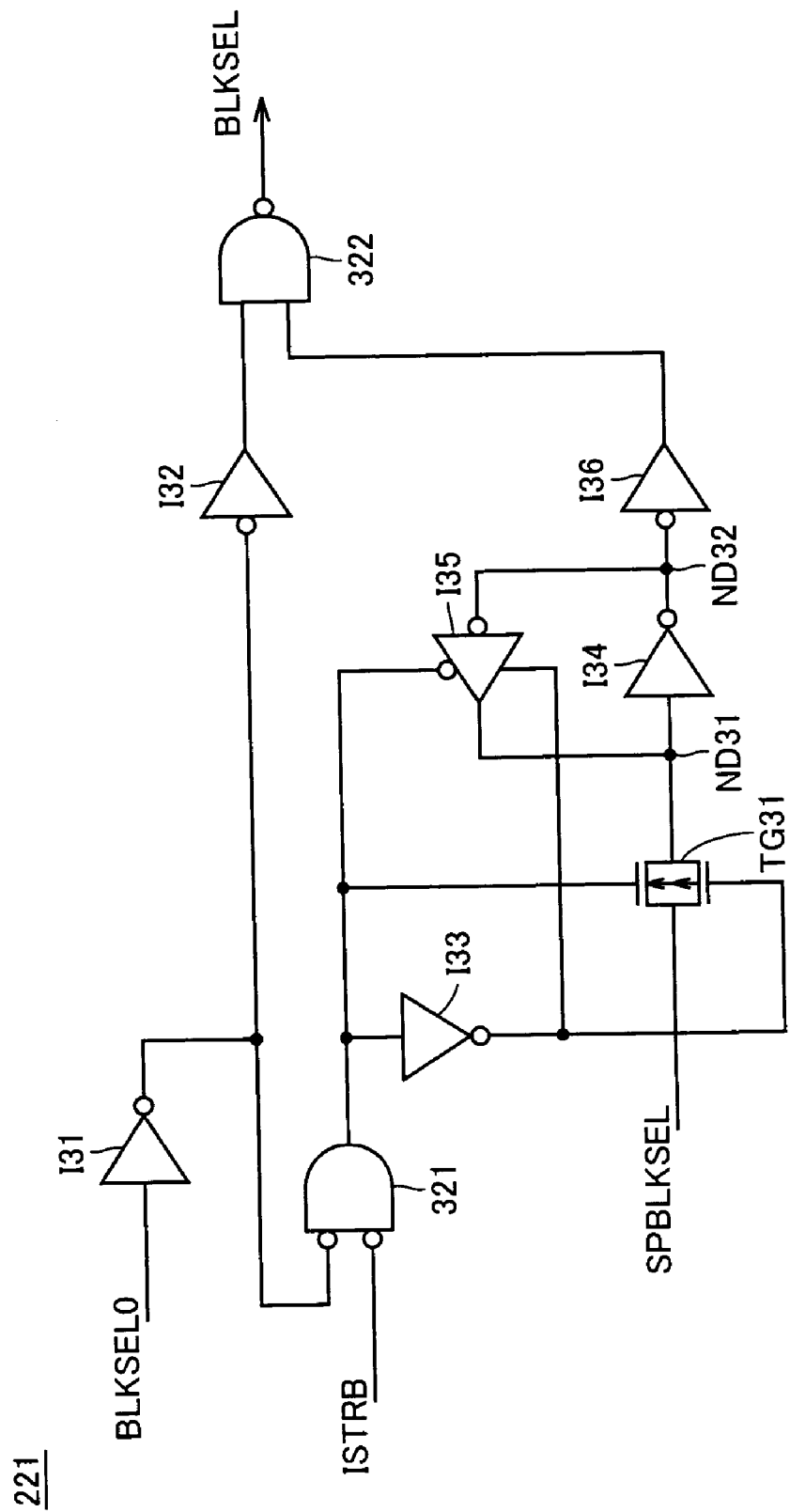
FIG. 8 is a circuit diagram showing a circuit configuration of a block address register 221 according to the second embodiment of the present invention.

Referring to FIG. 8, block address register 221 of the second embodiment includes inverters I31-I36, a NOR circuit 321, a NAND circuit 322, and a transfer gate TG31.

Inverter I31 inverts block select control signal BLKSEL0. Inverter I32 inverts a signal output from inverter I31. NOR circuit 321 receives a signal output from inverter I31 and data in strobe signal ISTRB. Inverter I33 inverts a signal output from NOR circuit 321. Transfer gate TG31, in response to the signal output from NOR circuit 321, electrically connects/disconnects spare block determination signal SPBLKSEL to/from a node ND31.

Inverter I34 has an input terminal connected to node ND31, and an output terminal connected to a node ND32. Inverter I35 has an input terminal connected to node ND32, and an output terminal connected to node ND31. Inverter I35 turns on/off in accordance with an inverse signal of the signal output from NOR circuit 321. Inverter I36 has an input terminal connected to node ND32. NAND circuit 322 receives signals output from inverters I32, I36, and outputs block determination signal BLKSEL. Hereinafter, circuit operations of the spare block determination signal transfer process, including the circuit operation of block address register 221, will be described with reference to operation waveforms of primary signals shown in FIG. 9.

Figure 9:
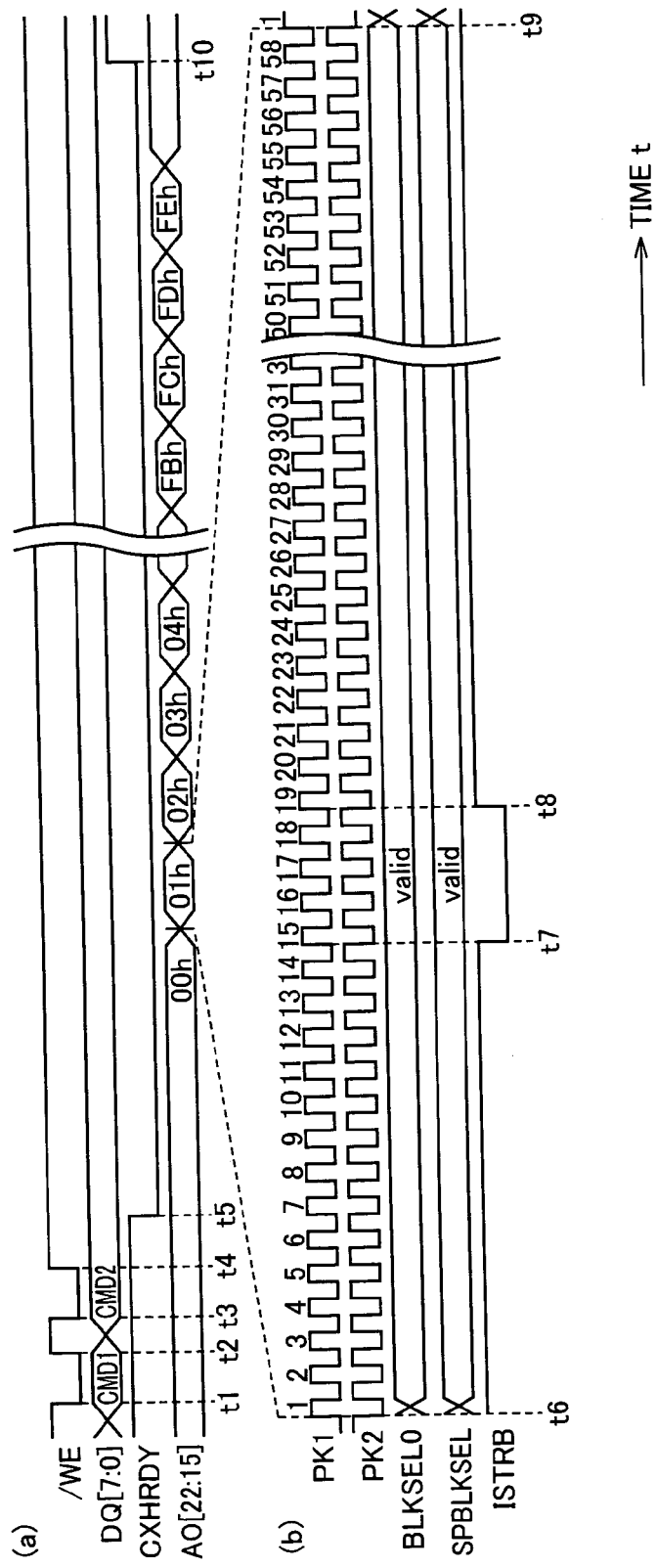
FIG. 9 is a timing chart illustrating operation waveforms of primary signals in a spare block determination signal transfer process.

Referring to (a) of FIG. 9, write enable signal/WE falls from an H level to an L level at time t1, and rises from the L level to an H level at time t2. In response, a command signal CMD1 is generated in data signal DQ[7:0]. Write enable signal/WE falls again from the H level to an L level at time t3, and rises from the L level to an H level at time t4. In response, a command signal CMD2 is generated in data signal DQ[7:0].

At time t5, write state machine information signal CXHRDY falls from an H level to an L level. In response, CPU 99 of FIG. 5 starts an operation. At time t6, internal address signal AO[22:15] is incremented. Hereinafter, operations of various signals from time t6 when internal address signal AO[22:15] is incremented to time t9 when it is incremented again will be described with reference to (b) of FIG. 9.

Referring to (b) of FIG. 9, internal CPU clock signals PK1, PK2 change complementarily to each other. CPU 99 of FIG. 5 increments internal address signal AO[22:15] in synchronization with internal CPU clock signals PK1, PK2. At time t6, block select control signal BLKSEL0 and spare block determination signal SPBLKSEL are each switched to a valid state. At time t7, data in strobe signal ISTRB falls from an H level to an L level in synchronization with internal CPU clock signals PK1, PK2.

As such, referring to FIG. 8, NOR circuit 321 outputs a signal of an H level when block select control signal BLKSEL0 is at an H level. As a result, transfer gate TG31 becomes conductive, and information of spare block determination signal SPBLKSEL is reflected to node ND31. Specifically, spare block determination signal SPBLKSEL is taken into block address register 221.

Referring to FIG. 8, block determination signal BLKSEL attains an L level (data "0") when block select control signal BLKSEL0 is at an H level and a signal of an L level is taken into block address register 221. The data "0" is used as the defective spare block information to enable overwrite when a normal spare block becomes defective during the test. At time t8, data in strobe signal ISTRB rises from the L level to an H level in synchronization with internal CPU clock signals PK1, PK2. Returning to (a) of FIG. 9, at time t10, write state machine information signal CXHRDY rises from the L level to an H level. In response, CPU 99 of FIG. 5 finishes the operation.

As such, the spare block replacement information is transferred in two stages of the read data signal transfer process where read data signal RDO read from flash memory array 200 is transferred to fuse register 211 and the spare block determination signal transfer process where spare block determination signal SPBLKSEL output from address determination circuit 210 is transferred to block address register 211. Accordingly, the number of signal lines required for transferring the spare block replacement information can be decreased.

As described above, according to the second embodiment, transferring the spare block replacement information in two stages of the read data signal transfer process and the spare block determination signal transfer process can reduce the number of signal lines required for transferring the spare block replacement information. The increase of the chip area can also be suppressed.

Third Embodiment

To determine a defective block in the non-volatile semiconductor memory device 1B of the second embodiment, it is necessary to monitor the leakage current for each block. Determining the leakage current by a tester takes a long time, and thus, a leakage current determination circuit needs to be provided within the chip. The current decision level should be determined in association with the effect of the leakage current size on reliability as well as the yield of the chips as products. To this end, the current decision level should be tunable. It is also necessary to determine whether the leakage current is one flowing in from the word line side or one flowing in from the well & source line side (select gate side) of the memory cell. Hereinafter, a non-volatile semiconductor memory device 1C according to the third embodiment of the present invention solving the above-described problems will be described with reference to FIG. 10.

Figure 10:
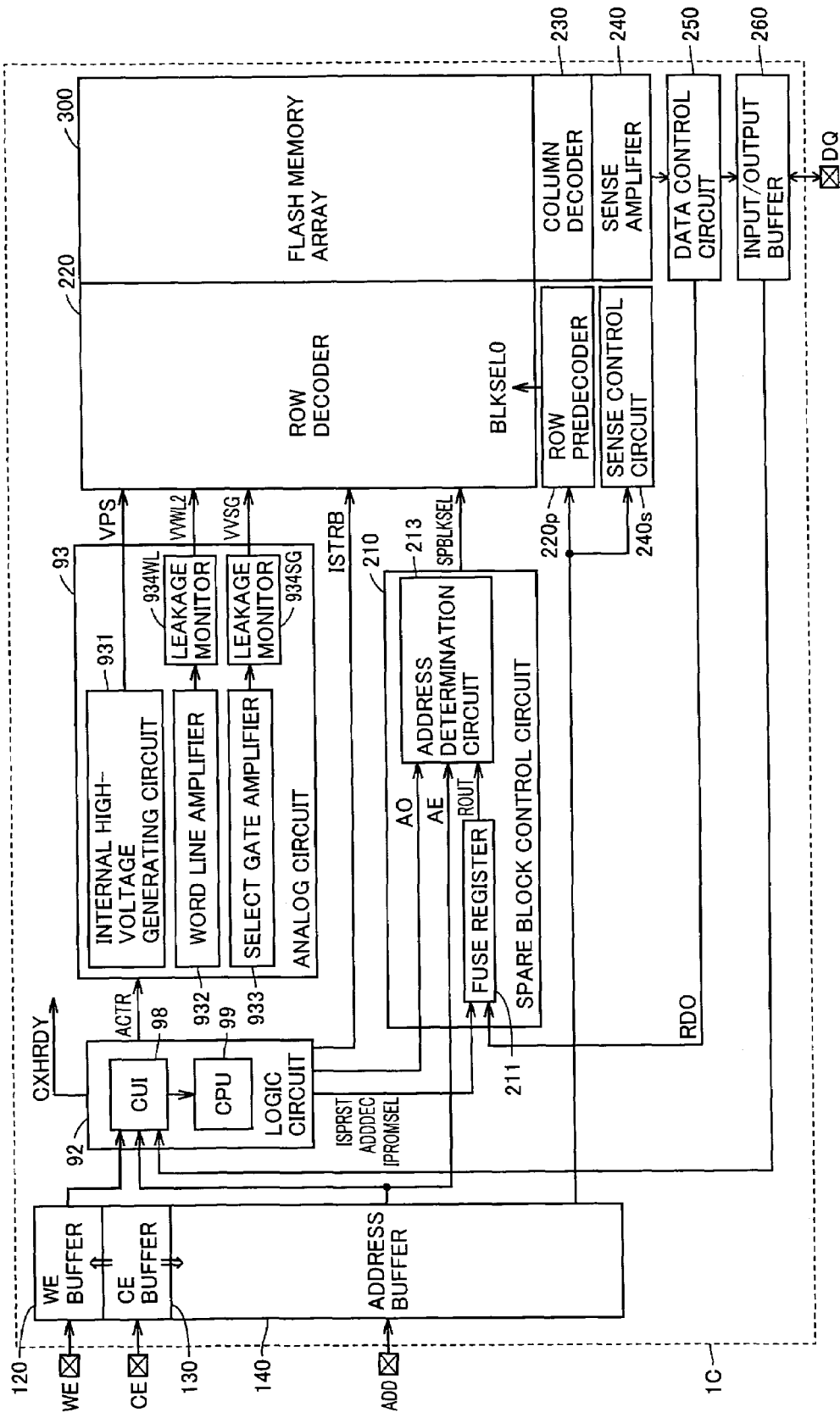
FIG. 10 is a block diagram showing a configuration of a non-volatile semiconductor memory device IC according to a third embodiment of the present invention.

Referring to FIG. 10, non-volatile semiconductor memory device 1C of the third embodiment includes a WE buffer 120, a CE buffer 130, an address buffer 140, a logic circuit 92, an analog circuit 93, a spare block control circuit 210, a flash memory array 300, a row predecoder 220p, a row decoder 220, a column decoder 230, a sense amplifier 240, a sense control circuit 240s, a data control circuit 250, and an input/output buffer 260.

WE buffer 120 performs buffer processing by externally receiving write enable signal/WE. CE buffer 130 performs buffer processing by externally receiving chip enable signal CE. Address buffer 140 performs buffer processing by externally receiving address signal ADD.

Logic circuit 92 includes a CUI 98 and a CPU 99. CUI 98 receives signals output from WE buffer 120, CE buffer 130 and address buffer 140, and decodes those commands. CPU 99 receives the decoded results of CUI 98, and controls the entire non-volatile semiconductor memory device 1C including flash memory array 300. CPU 99 starts an operation when write state machine information signal CXORDY makes a transition from an H level to an L level.

Analog circuit 93 includes an internal high-voltage generating circuit 931, a word line amplifier 932, a select gate amplifier 933, and leakage monitors 934WL, 934SG, and operates in response to an analog circuit control signal-ACTR received from logic circuit 92. Internal high-voltage generating circuit 931 generates an internal high-voltage signal VPS. Word line amplifier 932 amplifies a signal of a word line in flash memory 300. Select gate amplifier 933 amplifies signals of a select gate and a well & source line in flash memory 300. Leakage monitor 934WL monitors a leakage current flowing in from the word line side, and outputs a word line leakage signal VVWL2. Leakage monitor 934SG monitors a leakage current flowing in from the select gate and well & source line side, and outputs a select gate leakage signal VVSG.

Spare block control circuit 210 includes a fuse register 211 and an address determination circuit 213. Fuse register 211 receives register initialization signal ISPRST, address decode signal ADDDEC and information switching signal IPROMSEL output from logic circuit 92, and also receives read data signal RDO output from data control circuit 205, and outputs a register output signal ROUT to address determination circuit 213. Address determination circuit 213 receives internal address signals AO, AE and register output signal ROUT, and outputs a spare block determination signal SPBLKSEL to row decoder 220.

Row predecoder 220p receives an output form address buffer 140, and outputs a block select control signal BLK-SEL0 to row decoder 220. Row decoder 220 operates, receiving internal high-voltage signal VPS, word line leakage signal VVWL2 and select gate leakage signal VVSG output from analog circuit 93, data in strobe signal ISTRB output from logic circuit 92, and spare block determination signal SPBLKSEL output from spare block control circuit 210.

Sense control circuit 240s receives an output from address buffer 140, and controls sense amplifier 240. Input/output buffer 260 performs buffer processing on data signal DQ input from and output to the outside, and outputs the command signal to CUI 98. Description will now be made as to from where in flash memory 300 the leakage current flows. Note that flash memory 300 corresponds to memory mats 10-60 and their spare blocks in the first embodiment.

Figure 11:
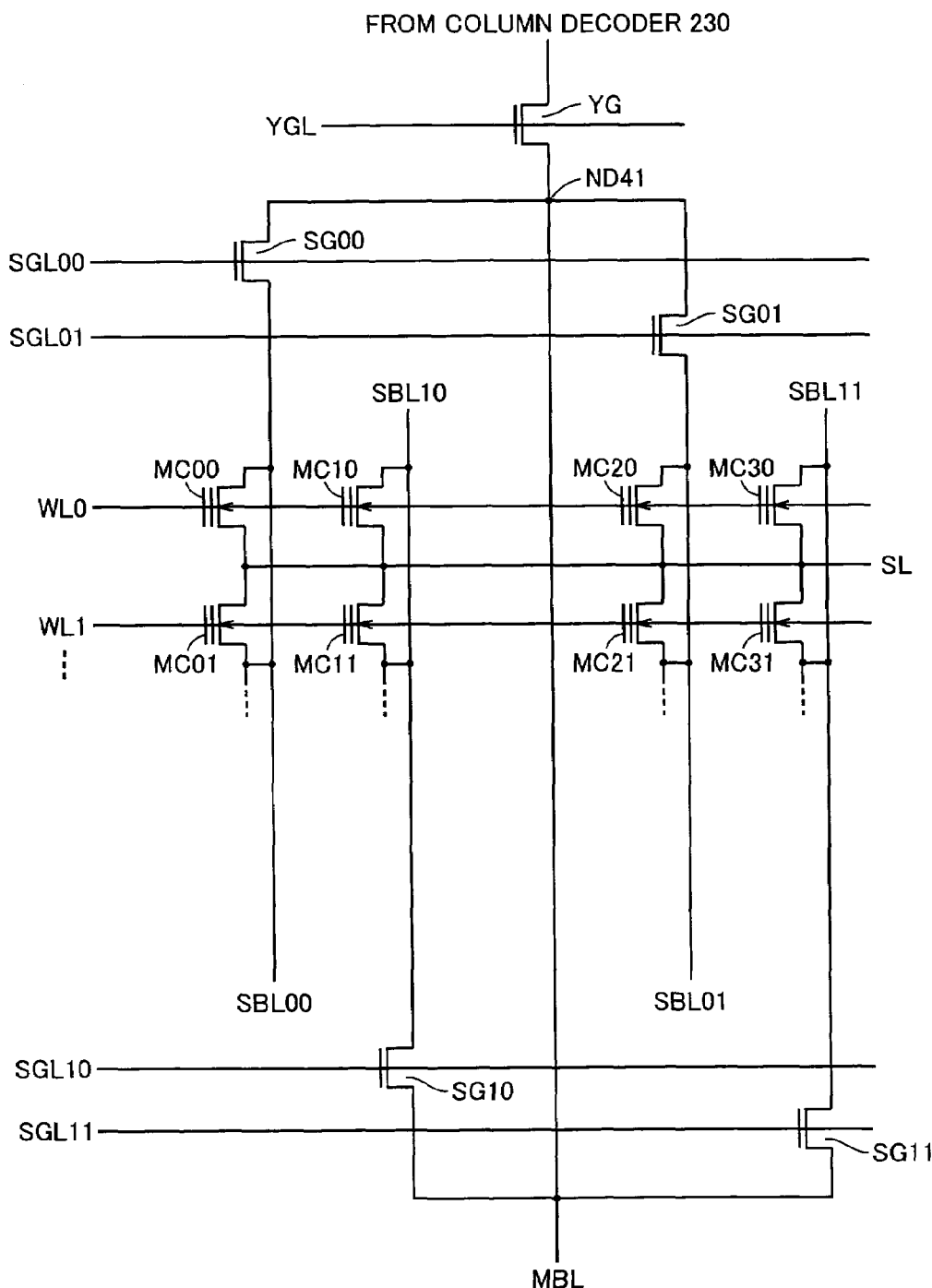
FIG. 11 is a circuit diagram showing a part of a circuit configuration of a flash memory 300 according to the third embodiment of the present invention.

FIG. 11 shows part of a circuit configuration of flash memory 300 according to the third embodiment of the present invention.

Referring to FIG. 11, flash memory 300 includes a Y gate transistor YG, select gates SG00, SG01, SG10, SG11 (each formed of an N channel MOS transistor), and flash memory cells MC00, MC01, MC10, MC11, MC20, MC21, MC30, MC31.

Y gate transistor YG is connected between main bit line MBL from column decoder 230 shown in FIG. 10 and a node ND41 on main bit line MBL. Y gate transistor YG electrically connects/disconnects column decoder 230 to/from flash memory 300 (node ND41) in response to a control signal from a Y gate select line YGL connected to its gate.

Select gate SG00 is connected between main bit line MBL and a sub bit line SBL00, and has its gate connected to a select gate line SGL00. Select gate SG01 is connected between main bit line MBL and a sub bit line SBL01, and has its gate connected to a select gate line SGL01. Each select gate electrically connects/disconnects the main bit line to/from the corresponding sub bit line in response to a control signal from the corresponding select gate line.

Flash memory cell MC00 is connected between sub bit line SBL00 and a source line SL, and has its gate connected to a word line WL0. Flash memory cell MC01 is connected between source line SL and sub bit line SBL00, and has its gate connected to a word line WL1. Flash memory cell MC10 is connected between a sub bit line SBL10 and source line SL, and has its gate connected to word line WL0. Flash memory cell MC11 is connected between source line SL and sub bit line SBL10, and has its gate connected to word line WL1.

Flash memory cell MC20 is connected between sub bit line SBL01 and source line SL, and has its gate connected to word line WL0. Flash memory cell MC21 is connected between source line SL and sub bit line SBL01, and has its gate connected to word line WL1. Flash memory cell MC30 is connected between a sub bit line SBL11 and source line SL, and has its gate connected to word line WL0. Flash memory cell MC31 is connected between source line SL and sub bit line SBL11, and has its gate connected to word line WL1.

Select gate SG10 is connected between main bit line MBL and sub bit line SBL10, and has its gate connected to a select gate line SGL10. Select gate SG11 is connected between main bit line MBL and sub bit line SBL11, and has its gate connected to a select gate line SGL11. Hereinafter, a specific structure when assuming that there is a short circuit in flash memory cell MC00 will be described with reference to FIG. 12.

Figures 12, 13:
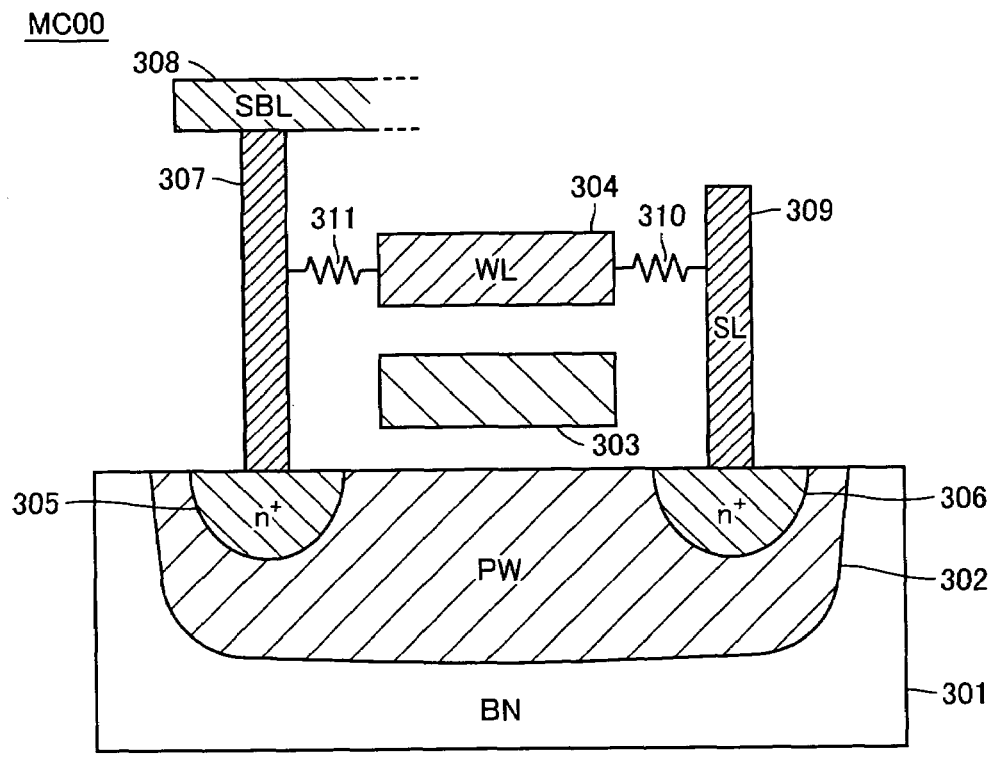
FIG. 12 is a cross sectional view showing a cross sectional structure assuming that there is a short circuit in a flash memory cell MC00.
FIG. 13 shows voltage states of respective portions of the flash memory cell MC00 when monitoring a word line leakage current and when monitoring a select gate leakage current.

Referring to FIG. 12, flash memory cell MC00 includes a substrate 30 1, a well layer 302, a floating gate layer 303, a word line layer 304, N-type high-concentration impurity regions 305, 306, a drain contact layer 307, a sub bit line layer 308, and a source line layer 309.

Well layer (PW) 302 is formed on substrate (BN) 301. Floating gate layer 303 is formed above well layer 302, and word line layer 304 is formed above floating gate layer 303. N-type high-concentration impurity regions 305, 306, having relatively high impurity concentration, are formed on respective sides of floating gate layer 303, to a prescribed depth from a main surface of substrate 301. Drain line layer 307 is formed on N-type high-concentration impurity region 305, and sub bit line layer 308 is formed on drain contact layer 307. Source line layer 309 is formed on N-type high-concentration impurity region 306.

As shown in FIG. 12, flash memory cell MC00 has a short-circuited portion 310 between word line layer 304 and source line layer 309. Flash memory cell MC00 further has a short-circuited portion 311 between word line layer 304 and drain contact layer 307. Short-circuited portions 310, 311 may cause a word line leakage current or a select gate leakage current. Hereinafter, voltage states of respective portions of flash memory cell MC00 when monitoring the word line leakage current and the select gate leakage current will be described with reference to FIG. 13.

As shown in FIG. 13, at the time of monitoring the word line leakage current, word line WL is set at a prescribed high voltage VP, well PW, source line SL and sub bit line SBL are set at a prescribed low voltage VN, and substrate BN is set at a power supply voltage VCC. Accordingly, a potential difference occurs from word line WL to well PW and source line SL, and leakage currents are measured from short circuits 310, 311. On the other hand, at the time of monitoring the select gate leakage current, well PW, substrate BN and source line SL are set at prescribed high voltage VP, word line WL is set at prescribed low voltage VN, and sub bit line SBL is set at VP−Vd (Vd is a PN diffusion potential). Accordingly, a potential difference occurs from well PW and source line SL to word line WL, and leakage currents are measured from short circuits 310, 311.

Setting the voltage states of the respective portions of flash memory cell MC00 in the above-described manner enables monitoring of the word line leakage current and the select gate leakage current in flash memory cell MC00. Hereinafter, analog circuit 93 and its peripheral circuit shown in FIG. 10 will be described in more detail with reference to FIG. 14.

Figure 14:
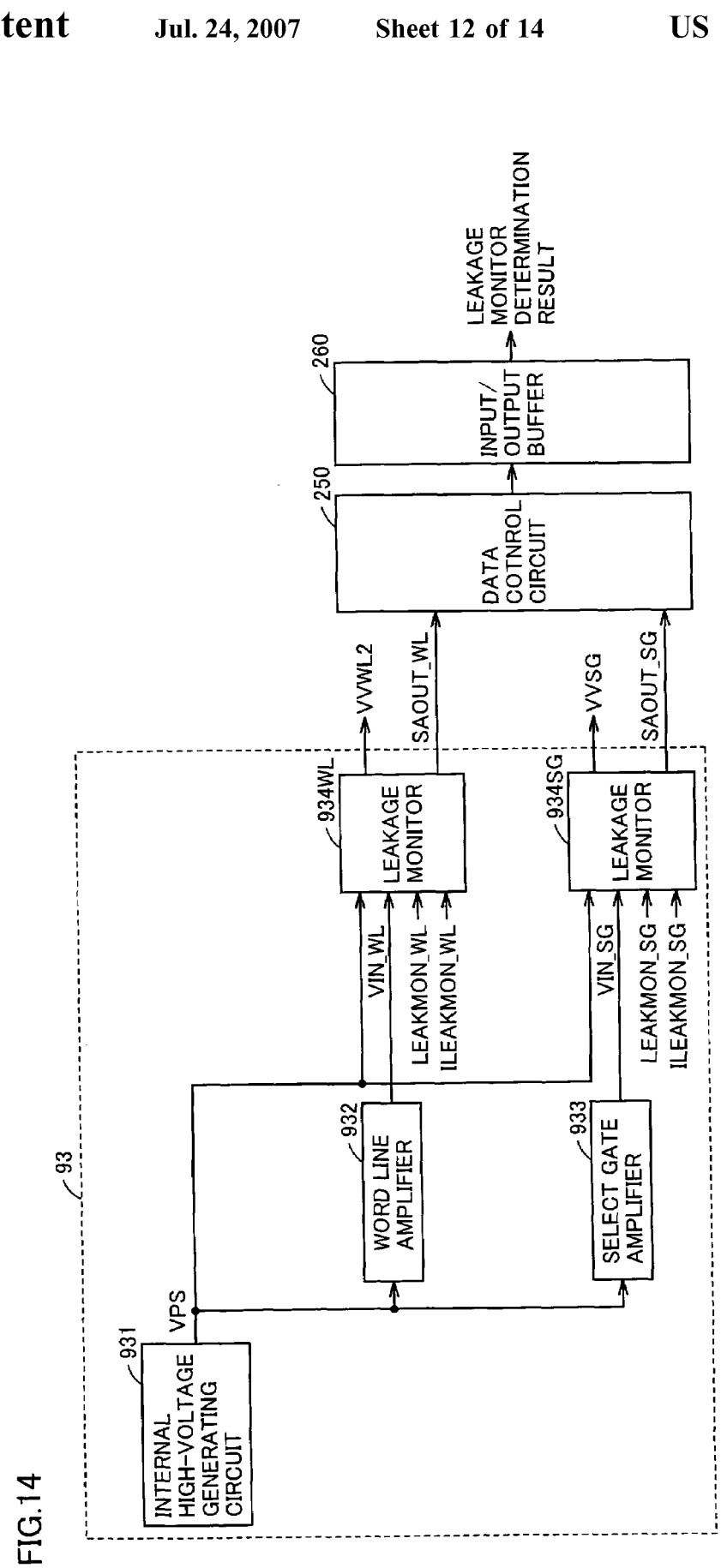
FIG. 14 is a block diagram showing in more detail an analog circuit 93 and its peripheral circuit according to the third embodiment of the present invention.

Referring to FIG. 14, analog circuit 93 includes internal high-voltage generating circuit 931, word line amplifier 932, select gate amplifier 933, and leakage monitors 934WL, 934SG. Internal high-voltage generating circuit 931 generates internal high-voltage signal VPS. Word line amplifier 932 receives internal high-voltage signal VPS, and outputs a monitor input signal VIN_WL. Select gate amplifier 933 receives internal high-voltage signal VPS, and outputs a monitor input signal VIN_SG.

Leakage monitor 934WL receives internal high-voltage signal VPS, monitor input signal VIN_WL, and leakage monitor activating signals LEAKMON_WL, ILEAKMON_WL, and outputs a word line leakage signal VVWL2 and a leakage monitor determination output signal SAOUT_WL. Leakage monitor activating signal ILEAKMON_WL is a complementary signal of leakage monitor activating signal LEAKMON_WL.

Leakage monitor 934SG receives internal high-voltage signal VPS, monitor input signal VIN_SG, and leakage monitor activating signals LEAKMON_SG, ILEAKMON_SG, and outputs a select gate leakage signal VVSG and a leakage monitor determination output signal SAOUT_SG. Leakage monitor activating signal ILEAKMON_SG is a complementary signal of leakage monitor activating signal LEAKMON_SG.

Data control circuit 250 receives leakage monitor determination output signals SAOUT_WL, SAOUT_SG, and outputs a leakage monitor determination result via input/output buffer 260. Hereinafter, a circuit configuration of a leakage monitor 934 as representatives of leakage monitors 934_WL, 934_SG will be described.

Figure 15:
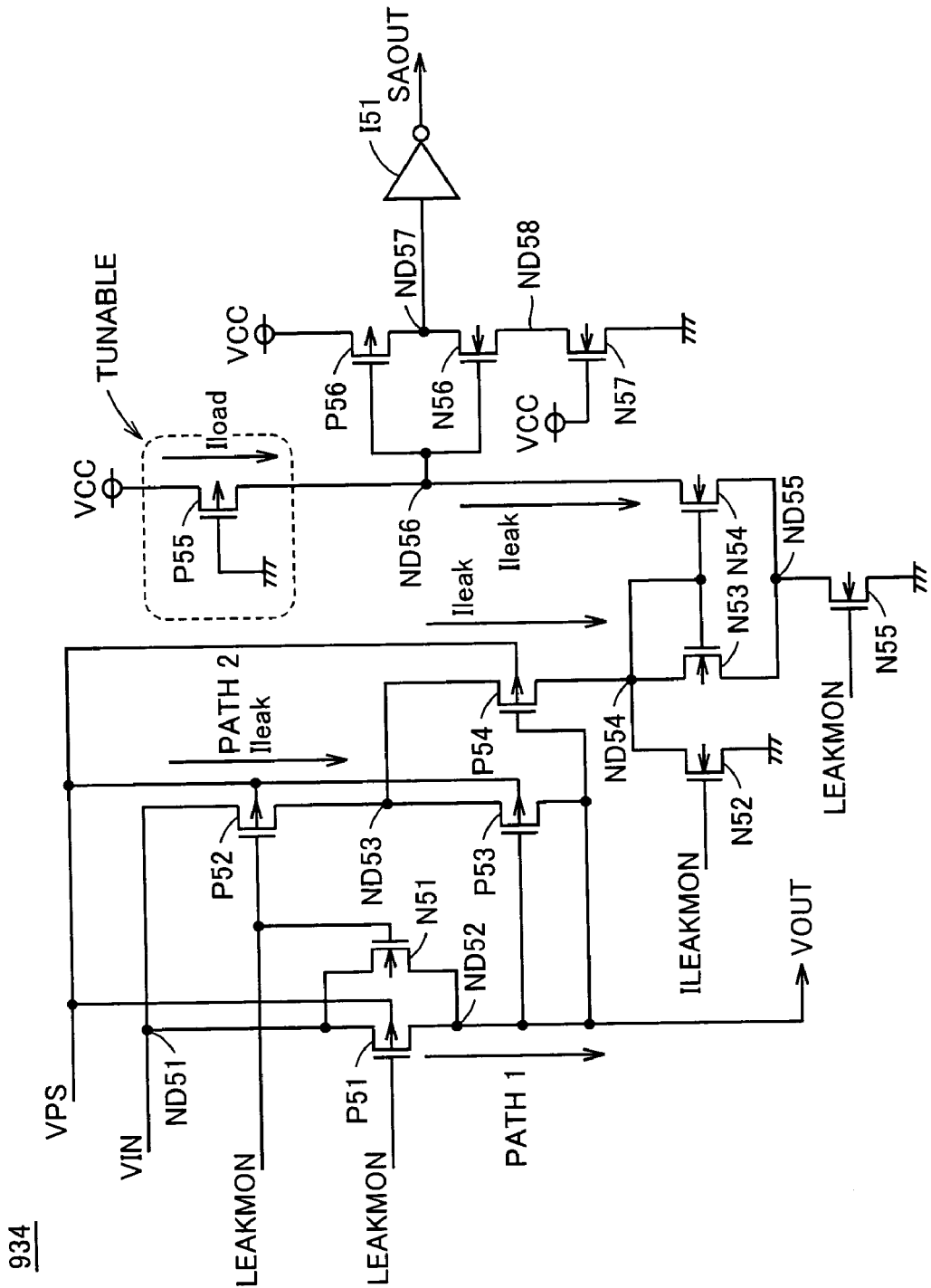
FIG. 15 is a circuit diagram showing a circuit configuration of a leakage monitor 934 according to the third embodiment of the present invention.

FIG. 15 shows the circuit configuration of leakage monitor 934 according to the third embodiment of the present invention.

Referring to FIG. 15, leakage monitor 934 includes P channel MOS transistors P51-P56, N channel MOS transistors N51-N57, and an inverter 151.

P channel MOS transistor P51 is connected between nodes ND51 and ND52, and has its gate receiving a leakage monitor activating signal LEAKMON. N channel MOS transistor N51 is connected between nodes ND51 and ND52, and has its gate receiving a leakage monitor activating signal ILEAKMON. Leakage monitor activating signal ILEAKMON is a complementary signal of leakage monitor activating signal LEAKMON. A monitor input signal VIN is input from node ND51, and a monitor output signal VOUT is output from node N52. A path through which monitor output signal VOUT is output via node ND52 is called "path 1".

P channel MOS transistor P52 is connected between nodes ND51 and ND53, and has its gate receiving leakage monitor activating signal ILEAKMON. P channel MOS transistor P53 is connected between nodes ND53 and ND52, and has its gate connected to node ND52. P channel MOS transistor P54 is connected between nodes ND53 and ND54, and has its gate connected to node ND52. A high voltage of internal high-voltage signal VPS is applied to the respective wells of P channel MOS transistors P51-P54. A path through which monitor output signal VOUT is output via node ND53 is called "path 2".

N channel MOS transistor N52 is connected between node ND54 and a ground node, and has its gate receiving leakage monitor activating signal ILEAKMON. N channel MOS transistor N53 is connected between nodes ND54 and ND55, and has its gate connected to node ND54. N channel MOS transistor N54 is connected between nodes ND56 and ND55, and has its gate connected to node ND54. N channel MOS transistor N55 is connected between node ND55 and a ground node, and has its gate receiving leakage monitor activating signal LEAKMON.

P channel MOS transistor P55 is connected between a power supply node of power supply potential VCC and node ND56, and has its gate connected to a ground node. As such, P channel MOS transistor P55 is always on. The current amount of load current Iload flowing through P channel MOS transistor P55 can be adjusted by changing the size (the ratio between channel width W and channel length L) of P channel MOS transistor P55. That is, the size of Pchannel MOS transistor P55 is tunable.

P channel MOS transistor P56 is connected between a power supply node of power supply potential VCC and a node ND57, and has its gate connected to node ND56. N channel MOS transistor N56 is connected between nodes ND57 and ND58, and has its gate connected to node ND56. N channel MOS transistor N57 is connected between node ND58 and a ground node, and has its gate connected to a power supply node of power supply potential VCC. As such, N channel MOS transistor N57 is constantly on.

P channel MOS transistor P56 and N channel MOS transistors N56, N57 constitute an inverter circuit. Inverter 151 has its input terminal connected to node ND57, and outputs leakage monitor determination output signal SAOUT. Hereinafter, a circuit operation of leakage monitor 934 will be described with reference to FIG. 16.

Figure 16:
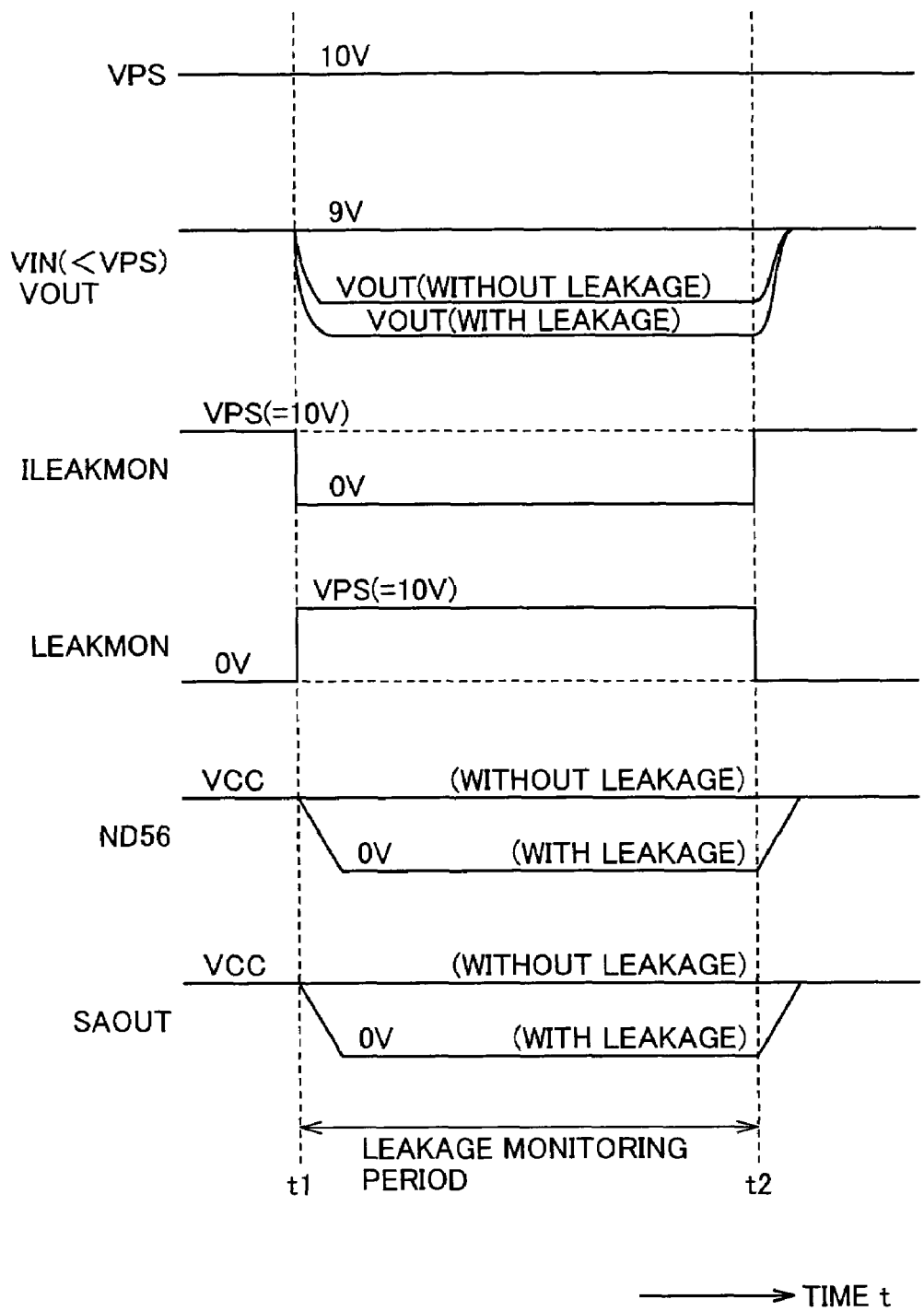
FIG. 16 is a timing chart illustrating a circuit operation of the leakage monitor 934 according to the third embodiment of the present invention.

Referring to FIG. 16, internal high-voltage signal VPS maintains a constant high voltage (of,.e.g., 10 V) whether or not it is in a leakage monitoring period. Monitor input signal VIN maintains a constant voltage (of, e.g., 9V) lower than internal high-voltage VPS, whether in the leakage monitoring period or not. Hereinafter, a normal operation period before time t1 or after time t2, and the leakage monitoring period from time t1 to time t2 will be described separately.

Firstly, in the normal operation period, leakage monitor activating signals ILEAKMON, LEAKMON are at an H level (internal high-voltage VPS) and an L level (e.g., 0V), respectively. In response, P channel MOS transistor P51 and N channel MOS transistors N51, N52 turn on, while P channel MOS transistor P52 and N channel MOS transistor N55 turn off.

As such, referring to FIG. 15, monitor output signal VOUT becomes equal to monitor input signal VIN via path 1. Since P channel MOS transistors P52, P53 are both off, the leakage current Ileak does not flow through path 2. As a result, leakage current Ileak does not flow through node ND56 via the current mirror, and thus, node ND56 attains a power supply potential VCC. In response, node ND57 attains an L level. Accordingly, leakage monitor determination output signal SAOUT becomes an H level (power supply potential VCC).

Next, in the leakage monitoring period, leakage monitor activating signals ILEAKMON, LEAKMON attain an L level (e.g., 0V) and an H level (internal high-voltage VPS), respectively. In response, P channel MOS transistor P51 and N channel MOS transistors N51, N52 turn off, while P channel MOS transistor P52 and N channel MOS transistor N55 turn on.

As such, referring to FIG. 15, monitor output signal VOUT attains a voltage somewhat reduced from monitor input signal VIN via path 2. Monitor output signal VOUT in the leakage monitoring period becomes lower when there is a current leakage than when there is no current leakage, with a greater voltage drop.

Leakage current Ileak flowing through path 2 is current-mirrored to node ND54 by means of P channel MOS transistors P53, P54. Leakage current Ileak flowing through node ND54 is further current-mirrored to node ND56 by means of N channel MOS transistors N53, N54. Accordingly, the potential level of node ND56 is determined in accordance with the relation in size between the load current Iload flowing through P channel MOS transistor P55 and the leakage current Ileak flowing through N channel MOS transistor N54.

When load current Iload is greater than leakage current Ileak (with no current leakage), node ND56 attains a power supply potential VCC. In response, node ND57 attains an L level. Accordingly, leakage monitor determination output signal SAOUT becomes an H level (power supply potential VCC). On the other hand, when leakage current Ileak is greater than load current Iload (with current leakage), node ND56 attains a ground potential, and in response, node ND57 attains an H level. As such, leakage monitor determination output signal SAOUT becomes an L level (e.g., 0V).

Load current Iload should be determined in association with its effect on reliability depending on its relation in current amount with leakage current Ileak as well as the yield of the chips as products. In the non-volatile semiconductor memory device 1C of the third embodiment, the size of P channel MOS transistor P55 can be changed to adjust the current amount of load current Iload.

As described above, according to the third embodiment of the present invention, leakage monitors 934WL, 934SG are used to monitor the leakage currents while adjusting the current amount of load current Iload. This enables direct monitoring of the leakage current in a defective block.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
  a memory array arranged in a U-shaped area in plan view;
  an analog circuit and a logic circuit arranged in a hollow portion formed by the arrangement of said memory array; and
  a power supply pad arranged in the vicinity of said analog circuit and said logic circuit, out of contact with said memory array, wherein
  said memory array is non-volatile, and has a plurality of banks,
  at least one of said plurality of banks includes a first region having normal block regions and a spare block region arranged in rows and columns, each normal block region being a unit of batch erase, and said spare block region substituting a normal block region when said normal block region is defective, and a second region having a boot block region that is a unit of batch erase smaller than said normal block region.

2. The semiconductor memory device according to claim 1, wherein said memory array includes a plurality of banks, each having a normal block and a spare block, each of said banks has a plurality of bit lines, and said normal block and said spare block in said bank share a column decoder that selects said bit lines and a sense amplifier circuit that senses and amplifies potentials of said bit lines.

3. The semiconductor memory device according to claim 1, wherein said U-shaped area includes first and second portions extending in parallel in a first direction, and a bottom portion extending in a second direction and being disposed between said first and second portions, the first, second and bottom portions being arranged in a U-shape, said memory array is non-volatile, said first and second portions each include two banks of said memory array, each of said banks has a plurality of bit lines, and said banks in each of said first and second portions share a sense amplifier circuit that senses and amplifies potentials of said bit lines.

4. The semiconductor memory device according to claim 1, wherein said first region is rectangular and blocks therein are squarely arranged in rows and columns.

5. A semiconductor memory device, comprising:

a plurality of memory blocks, each having a normal block and a spare block;

a region for storing memory array storing block information formed of spare block replacement information for each of said plurality of memory blocks and defective spare block information;

a spare block determination circuit receiving said block information and outputting a spare block determination signal determining whether said plurality of memory blocks are normal or defective; and a decode circuit receiving said spare block determination signal and performing decoding for each of said plurality of memory blocks, wherein said decode circuit includes a block address register receiving said spare block determination signal in response to a strobe signal.

6. The semiconductor memory device according to claim 5, wherein said defective spare block information takes data "0" when defective.

7. A semiconductor memory device, comprising:

a non-volatile memory array having a plurality of banks, at least one of said plurality of banks includes a first region having normal block regions and a spare block region, each of said normal block regions is a unit of batch erase, and said spare block region is used as a normal block region when said normal block region is defective, and a second region having a boot block region that is a unit of batch erase smaller than said normal block region.

* * * * *